United States Patent [19]

Conturo et al.

[11] Patent Number: 4,766,381

[45] Date of Patent: Aug. 23, 1988

[54] DRIVEN INVERSION SPIN ECHO MAGNETIC RESONANCE IMAGING

[75] Inventors: Thomas E. Conturo; Robert M. Kessler, both of Nashville, Tenn.

[73] Assignee: Vanderbilt University, Nashville, Tenn.

[21] Appl. No.: 84,575

[22] Filed: Aug. 12, 1987

[51] Int. Cl.$^4$ ............................................. G01R 33/20
[52] U.S. Cl. ................................................... 324/309
[58] Field of Search ....................... 324/307, 309, 312; 128/657

[56] References Cited

U.S. PATENT DOCUMENTS

| | | | |
|---|---|---|---|
| 4,254,778 | 3/1981 | Clow et al. | 128/653 |
| 4,558,277 | 12/1985 | Post et al. | 324/309 |
| 4,703,270 | 10/1987 | Hall et al. | 324/309 |

OTHER PUBLICATIONS

Mitchell et al., Invest. Gative Raviology, vol. 19, No. 5, pp. 350–360 (1984).
Jensen et al., Medical Physics 14, 38–42 (1987).
M. H. Levitt et al., Journal of Magnetic Resonance, 33, 473 (1979).
ED2EJ, H. T. J. of Magnetic Resonance, 17, 301 (1975).
Bydder et al., Journal of Computer Assisted Tomography, 9, 659–675 (1985).
Driven Equilibrium Fourier Transform Spectroscopy, Becker et al., Jour. of Amer. Chem. Soc. 91:27, 12/31/69.

*Primary Examiner*—Stewart J. Levy
*Assistant Examiner*—Kevin D. O'Shea
*Attorney, Agent, or Firm*—Arnold B. Silverman

[57] ABSTRACT

A method of inversion spin echo magnetic resonance imaging includes providing a specimen positioned within a main magnetic field, a source of RF signals, a receiver for receiving signals emitted from the specimen responsive to the RF pulses and emitting responsive output signals, a computer for receiving the output signals from the receiver and establishing image information related thereto and a visual display for displaying images obtained from the image information. During an initial echo period, imposing three pulses on the main magnetic field with the first and third pulses having a first value and the second pulse having a second value which may be approximately double the first value, creating an echo with the second pulse and the third pulse converting this echo into negative longitudinal magnetization. After an inversion period during a second echo period imposing fourth and fifth RF pulses in the same sequence and generally of magnitude as the first and second pulses, respectively, creating a spin echo with the fifth pulse and response to said spin echo emitting output information from the receiver means to the computer with the computer establishing image information which is delivered to the visual display. The apparatus provides magnetic field generation apparatus to provide a main magnetic field on a specimen and RF signal generating apparatus for emitting pulsed RF signals in order to establish predetermined pulse sequences and magnitudes with the resultant receiver and computer serving to convert the same into image information for visual display.

47 Claims, 4 Drawing Sheets

DRIVEN INVERSION SPIN ECHO MAGNETIC RESONANCE IMAGING

BACKGROUND OF THE INVENTION

1. Field of the Invention

This invention relates to improvements in inversion spin echo magnetic resonance imaging and, more specifically, it relates to a system which through control of certain perameters, will provide image contrast and feature detection which may be enhanced with respect to prior art practices while employing shorter scanning times.

2. Description of the Prior Art

The advantageous use of noninvasive and nondestructive test procedures has long been known in both medicine and industrial applications. In respect of medical uses, it has also been known that limiting a patient's exposure to potentially damaging x-ray radiation may advantageously be accomplished through the use of other noninvasive imaging procedures such as, for example, ultrasound imaging and magnetic resonance imaging. As to the latter, see, for example, The Fundamentals of Magnetic Resonance Imaging by Hinshaw et al. Technicare Corporation, 1984.

In a general sense, magnetic resonance imaging involves providing bursts of radio frequency energy on a specimen positioned in a main magnetic field in order to induce responsive emission of magnetic radiation from the hydrogen nuclei or other nuclei. The emitted signal may be detected in such a manner as to provide information as to the intensity of the response and the spatial origin of the nuclei emitting the responsive magnetic signal. In general, the imaging may be performed in a slice, or plane or multiple planes or three-dimensional volume with information corresponding to the responsively emitted magnetic radiation being received by a computer which stores the information in the form of numbers corresponding to the intensity of the signal. The Pixel value is established in the computer by employing Fourier Transformation which coverts the signal amplitude as a function of time to signal amplitude as a function of frequency. The signals are stored in the computer and may be delivered with or without enhancement to a video screen display such as a cathode-ray tube, for example, wherein the image created by the computer output will be presented through black and white presentations varying in intensity or color presentations varying in hue and intensity (and "saturation" or amount of "white" mixed in).

It has been known that magnetic resonance image intensity is dependent upon certain inherent physical properties of the tissues being investigated and timing intervals chosen by the user of the equipment. The physical properties of the tissues include the hydrogen density or density of the sensitive nucleus and two time factors which are known as $T_1$ and $T_2$. $T_1$ which is also known as "$T_1$ relaxation" is a measure of how long it takes the sample to regain its potential to produce a signal after a first pulse has caused it to respond to the pulsed RF excitation. This is sometimes considered as the time required to restore the longitudinal magnetization. $T_2$ or "$T_2$ relaxation" is a measure of the amount of time required for the magnetic resonance signal emitted by the radio frequency energy-excited proton to ideally dissipate to a point where it is generally imperceptible. At equilibrium, the transverse component of magnetization is at zero and the longitudinal component is equal to the initial magnetization. Decay to the former equilibrium is governed by the $T_2$ relaxation and decay to the latter equilibrium is governed by the $T_1$ relaxation. By properly selecting the timing intervals, the differences in hydrogen density or density of the sensitive nucleus (herein referred to as "N"), $T_1$ and $T_2$ values produce a difference in image intensity.

In general, in magnetic resonance imaging, it has been recognized that the differences in tissue $T_1$ and $T_2$ values are generally correlated such that an increase in one is accompanied by an increase in the other and a decrease in one is accompanied by a decrease in the other. Unfortunately, such parallel change does not contribute to a cooperative change in image intensity. For example, an increase in $T_2$ causes an absolute increase in intensity while an increase in $T_1$ usually decreases intensity. As a result, it is necessary to select the sequences so as to be dependent on either $T_1$ or $T_2$, but not both. The unfortunate consequence of such an approach is that many lesions or other elements desired to be visualized will go undetected if they only cause a significant change in one of the relaxation times $T_1$ or $T_2$. Also, competing $T_1$ and $T_2$ effects in respect of image intensity result in less contrast than would be the case if $T_1$ and $T_2$ effects were cooperative. Also, separate $T_1$ sensitive and $T_2$ sensitive pulse sequence acquisitions must be used to screen for both $T_1$ and $T_2$ changes, resulting in lengthy clinical studies.

It has been known to use spin echo and inversion spin echo techniques in magnetic resonance imaging. See generally pages 32 through 50 of the hereinbefore cited Hinshaw et al. publication.

In conventional spin echo imaging procedures, after an initial 90 degree pulse or general alpha-degree pulse, there are at predetermined intervals 180 degree RF pulses or magnetic field pulses which serve to refocus the transverse magnetization after the signal from the nuclei disappears to thereby cause the signal to reappear. These pulses which effect a spin echo will herein be referred to as "refocussing pulses". This regenerated signal is referred to a "spin echo". Depending upon whether the 180 degree pulses are in phase or 90 degrees out of phase with the 90 degree pulse, the resultant signals will either be solely positive or alternate between positive and negative. To the extent to which $T_2$ relaxation has occurred prior to the generated spin echo, that portion of the signal is irretrievably lost.

In inversion recovery spin echo practices, there is an initial 180 degree pulse followed after a predetermined time period by a 90 degree pulse followed by a further time period and a repeat of the 180 degree spin echo cycle. This results in a potential for negative signals and a spreading out of the longitudinal magnetization thereby permitting images with greater dynamic range of contrast. The time between the first 180 degree pulse which inverts all magnetization and the subsequent 90 degree pulse which initiates the reading of the recovered longitudinal magnetization is deemed to be the "inversion time" which will be referred to herein as "TI".

It has been known in inversion-spin echo sequences of short TI intervals to provide additive $T_1$ and $T_2$ effects. See R. E. Steiner et al., Society of Magnetic Resonance in Medicine (1985), page 1208. The difficulty with this sequence is that it requires TI intervals which are much shorter than $T_1$ so that the signals remain negative. As a result, $T_1$ sensitivity is sub-optimal as it is maximal when TI equals $T_1$ and contrast may be reduced even though $T_1$ and $T_2$ effects are additive. Moreover, the longitudinal magnetization recovers to nearly a zero magnitude during the short TI interval resulting in low signal to noise ratios.

It has been know to evaluate with mathematical models the desired pulse sequences and timing intervals in magnetic resonance imaging employing spin echo and inversion spin echo pulse sequences. See Mitchell et·al. INVESTIGATIVE RADIOLOGY, Vol. 19, No. 5, pp. 350–360 (1984).

U.S. Pat. No. 4,254,778 discloses a system for driven equilibrium wherein after data collection, long TD intervals are sought to be avoided by applying a 90-180-90 triplet with the second 90 degree pulse shifted 180 degrees and the 180 pulses shifted 90 degrees in phase with respect to the first 90 degree pulse. This is said to drive the transverse magnetization at the spin echo peak back up to the positive longitudinal direction to thereby hasten recovery of longitudinal magnetization. This prior system has as its primary objective shortening of overall repetition time i.e., to produce maximal intensity in the shortest time. This is undesirable for certain types of imaging such as medical imaging as intensity is maximized at the expense of image contrast e.g., there is no sensitivity to differences in $T_1$ as longitudinal magnetization is restored instantly regardless of $T_1$ value. See also, Jensen et al., Medical Physics 14, 38–42 (1987) which discloses a 90-180-90 pulse triplet for saturating the signals outside of a plane. This triplet employs RF signals to drive the spin echo signal to the positive longitudinal direction rather than the negative direction of the present invention.

In spite of the foregoing, there remains a very real and substantial need to provide inversion spin echo procedures which will facilitate improved contrast with relatively short scanning periods.

SUMMARY OF THE INVENTION

As used herein, the terms "specimen" or "test specimen" shall refer to any object placed in the main magnetic field for imaging and shall expressly include but not be limited to members of the animal kingdom including humans; test specimens such as biological tissue, for example, removed from such members of the animal kingdom and inanimate objects which may be imaged by NMR or contain water or sources of other sensitive nuclei.

The present invention provides an improved method of inversion spin echo magnetic resonance imaging. A specimen is positioned within a main magnetic field and a source of RF signals in the form of pulses is positioned adjacent to the specimen. Receiver means for receiving signals emitted from the specimen responsive to the imposed RF pulses are positioned adjacent to the specimen and emit responsive output signals upon receipt of the specimen responses. Computer means receive the output signals from the receiver means and establish image information related thereto. The image information is provided directly or indirectly after storage to visual display means for displaying images from the image information received from the computer.

During an initial echo period, three RF pulses are imposed on the main magnetic field with the first and third pulses rotating the magnetization by a first value which may be 90 degrees, and the second pulse having a second value which is substantially larger than the first value and may be approximately double the first value e.g. 180 degrees. An echo is created with the second pulse and the third pulse converts this echo into negative longitudinal magnetization. After an inversion period and during a second echo period which follows, fourth and fifth RF pulses are imposed on the sample in the main magnetic field thereby creating a spin echo with the fifth pulse. The first through fifth pulses are preferably applied with an oscillating field generally perpendicularly to the main magnetic field. The receiver means receives the spin echo and the signal is converted to a digital signal by an analog-to-digital converter. The computer means receives the signal and responsive thereto establishes image information which is delivered to the visual display means in order to provide an image.

This cycle is preferably repeated a predetermined number of times in order to obtain the desired amount of data. In general, it is preferred that the image information be provided in accordance with a preferred relationship as set forth in Formula 2 hereinafter.

It is preferred that the initial echo period $TE_1$ has a duration equal in time to the $T_2$ relaxation period and that the second echo period $TE_2$ has a duration substantially less than the the value of the $T_2$ relaxation time. The inversion period preferably has a duration approximately equal to the value of the $T_1$ relaxation time and the delay time TD for $T_1$ recovery is preferably much greater than the value of the $T_1$ relaxation period. It will be appreciated that use of a driven equilibrium after data collection at spin echo 36 can result in substantial shortening of the delay time TD.

The apparatus of the present invention employs magnetic field generating means for establishing a main magnetic field on a specimen and RF signal generating means for emitting pulsed RF signals to at least portions of the main magnetic field passing through the specimen. The pulse generating means has means for emitting three pulses during an initial echo period with the first and third pulses having a first value and the second pulse having a second value which is substantially larger than the first value and may be approximately double that of the first value in order to create with said second pulse an echo which is converted to negative longitudinal magnetization by the third pulse. After an inversion period during a second echo period, fourth and fifth pulses are imposed on the main magnetic field in the same sequence as the first and second pulses respectively in order to create a spin echo with the fifth pulse. In the event that the second and fifth pulses are magnetic gradient pulses the second value will have the effect of the second and fifth RF pulses. Receiver means receive signals emitted from the specimen responsive to the RF pulses and emit responsive output signals which in turn are received by computer means which establish image information related thereto. Visual display means display the images from the computer means image information.

In lieu of the second and fifth 180 degree RF pulses, refocussing gradient pulses may be employed.

It is an object of the present invention to provide an improved inversion spin echo magnetic resonance imaging system which facilities the use of reduced scanning times while providing good quality image contrast.

It is a further object of the present invention to provide a pulse sequence in which $T_1$ and $T_2$ sensitivity will be near maximal and additive for groups of tissues positively correlated with $T_1$ and $T_2$ values.

It is an object of this invention to provide such a system wherein parallel $T_1$ and $T_2$ changes produce parallel changes in pixel intensity.

It is a further object of this invention to provide such a system which has a desired signal to noise ratio.

It is a further object of the present invention to provide computer means which facilitate accomplishing the objectives of the invention.

It is a further object of the present invention to provide such a system which is compatible with existing equipment and is adapted to be economical to manufacture and use and may be used without significant retraining of individuals conducting the tests.

It is a further object of the present invention to provide such a system which is particularly adapted to provide improved contrast in magnetic resonance imaging of features in specimens.

These and other objects of the present invention will be more fully understood from the following description of the invention with reference to the illustrations appended hereto.

DESCRIPTION OF THE PREFERRED EMBODIMENTS

Figure 1:
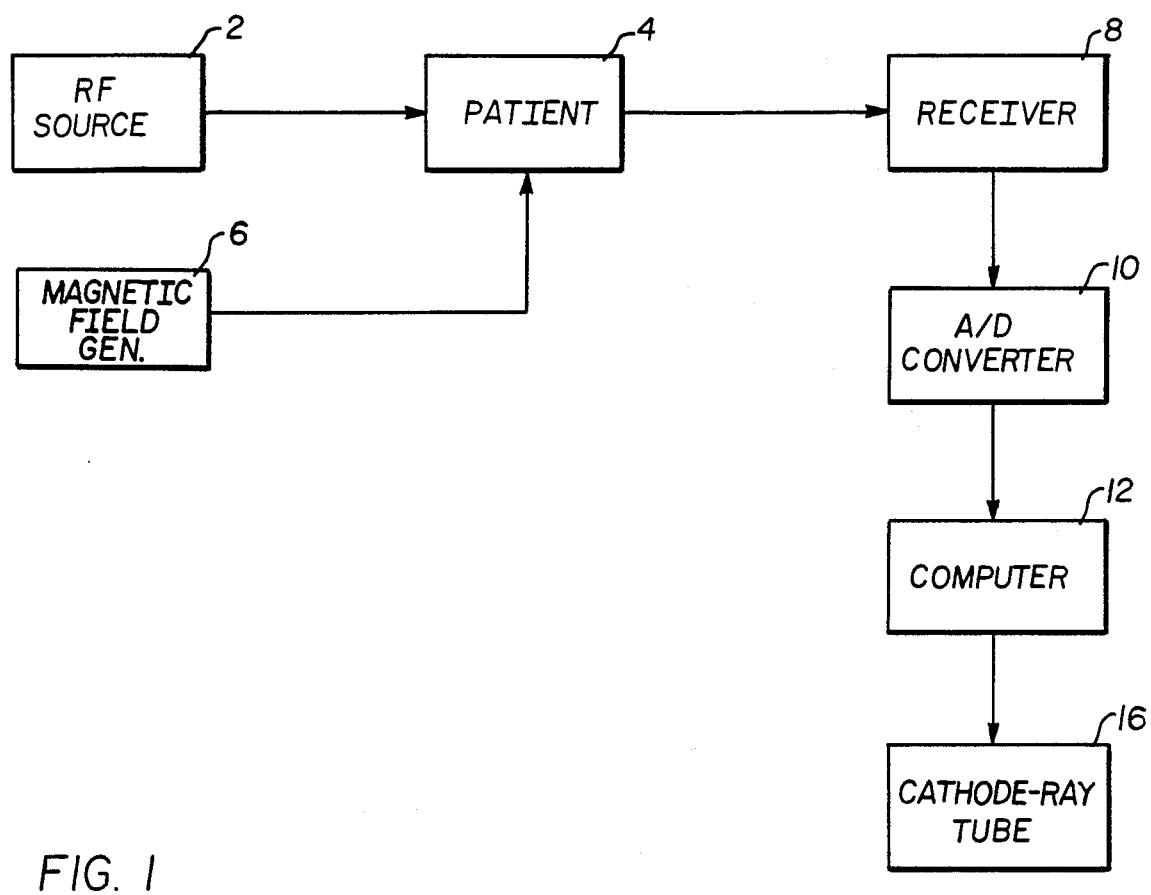
FIG. 1 is a schematic illustration of a magnetic resonance imaging system.

A schematic illustration which presents the general concept of magnetic resonance imaging is shown in FIG. 1. An RF source 2 provides a pulse of radio frequency energy to the specimen in the form of a patient 4 placed in a magnetic field (which is on continuously). The specimen is generally aligned with the main magnetic field and the RF pulses are imposed perpendicular thereto. The main magnetic field is generated by magnetic field generator 6 and is generally perpendicular to the radio frequency (RF) field. This results in excitation of the nuclei within the area or volume to be imaged and causes responsive emission of magnetic energy which is picked up by receiver 8.

The receiver 8 may be a coil which has a voltage induced in it as a result of such responsive emission of magnetic energy. As a practical matter, separate coils or identical coils may be employed as the RF source 2 and the receiver 8. The signal emerging from receiver 8 passes through analog-to-digital (A/D) converter 10 and enters computer 12. Within the computer 12, the Fourier Transformations of signals converts the plot of amplitude versus time to a map of the distribution of frequencies by plotting amplitude versus frequency. In the computer, the Fourier Transformations are performed in order to establish the intensity values and locations of the specific pixels. These values may be stored, enhanced or otherwise processed and emerge to be displayed on a suitable screen, such as a cathode-ray tube 16.

Figure 2:
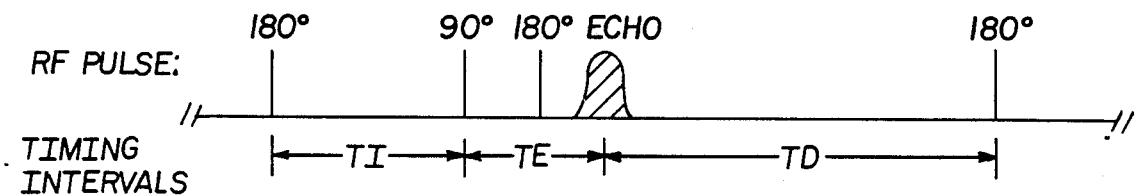
FIG. 2 is a representation of a conventional prior art inversion spin echo pulse sequence.

In the conventional prior art inversion spin echo procedures, as is shown in FIG. 2, an initial pulse of 180 degrees is followed after elapse of an inversion period TI by a pulse of 90 degrees which, in turn, is followed by a pulse of 180 degrees which is midway between the 90 degree pulse and the echo as measured by time "TE". Time TD is the delay time for $T_1$ relaxation after the spin echo and before the initiation of another cycle.

The present invention contemplates a major departure from the inversion spin echo magnetic resonance imaging concept. It contemplates the inversion pulse being a 90 degree pulse followed by a 180 degree pulse which, in turn, is followed by a 90 degree pulse. Such an inversion pulse triplet has been disclosed in connection with nuclear magnetic resonance spectroscopy and has been employed principally to correct for instrumentation imperfections, but not imaging. See M. H. Levitt et al., Journal of Magnetic Resonance, 33, 473 (1939); Edzes, J. Magnetic Resonance 17, 301 (1975); and Bydder et al., Journal of Computer Assisted Tomography 9, 659–675 (1985).

Figure 3:
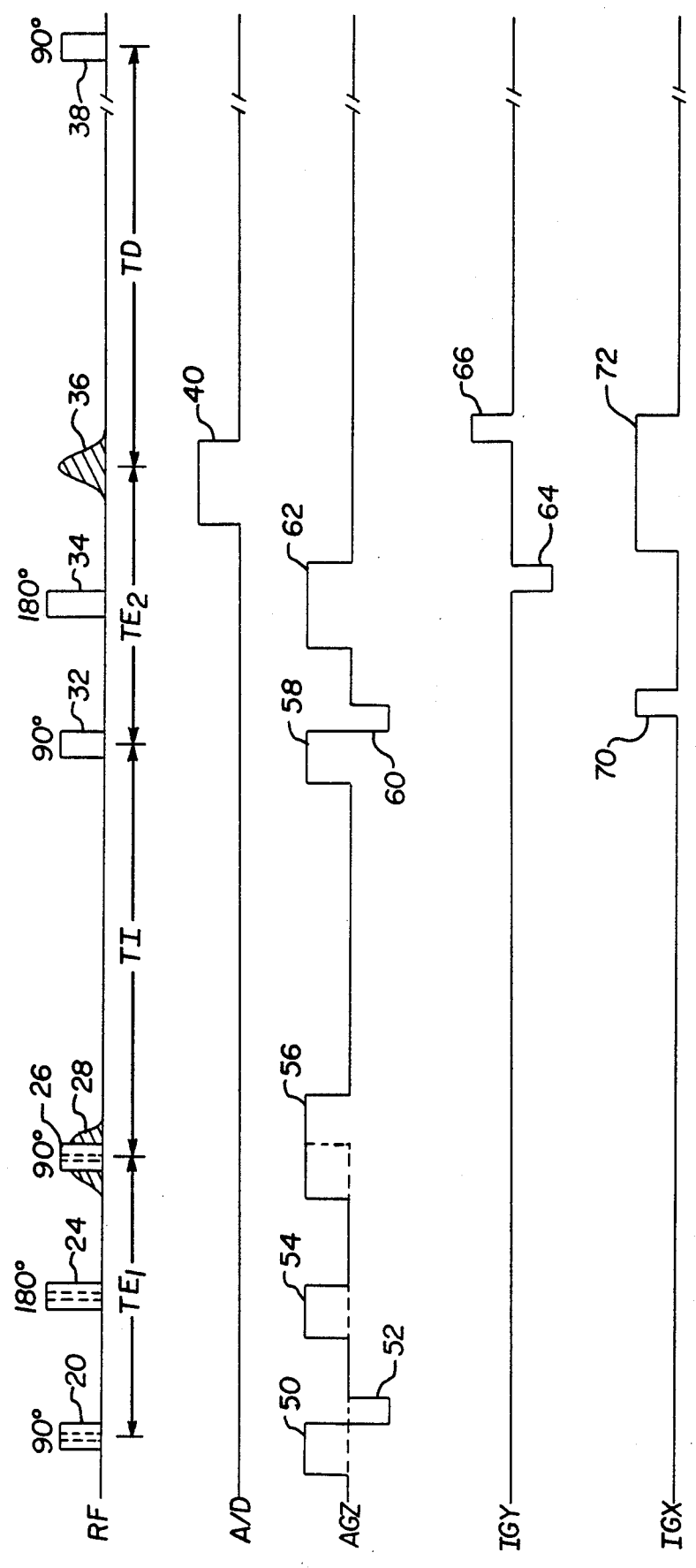
FIG. 3 is a representation of an RF sequence of the present invention and corresponding A/D converter and gradient values.

FIG. 3 illustrates a pulse sequence of the present invention which is designated as "driven inversion spin echo magnetic resonance imaging". Referring to FIGS. 1 and 3 and noting that the specimen in FIG. 1 is a patient, reference will be made to an arbitrarily oriented X-Y-Z gradient coordinate system and X'-Y'-Z' RF coordinate system which rotates about Z' at the frequency of the RF pulse (not shown). Z is normal to the selected slice or slices and Z' is along the main magnetic field. Assume imaging of a single transverse slice so that the patient has the longitudinal portions of his or her body aligned with the Z-axis along the main magnetic field. The Z-axis will also provide a Z-axis gradient which has planes of differing magnetic strength oriented generally perpendicularly with respect to the Z-axis and in relative spaced relationship. The Z-axis magnetic gradient serves to define the slices of the patient which will be imaged. The main magnetic field will cause nuclear magnetic moments of $^1H$ nuclei (herein referred to as "protons") or other sensitive nuclei in the patient to be aligned parallel or antiparallel thereto in such a manner that the resultant spin vector is oriented generally parallel to the field's longitudinal axis. When pulses of RF energy of a frequency related to the resonant frequency associated with the main magnetic field are applied with an oscillating field perpendicular to the main magnetic field, resonance is established at that frequency so that energy is absorbed in the patient. The resultant spin vectors of the protons are caused to rotate from their orientation along the Z'-axis toward the X' or Y' axis. If the RF pulse is adequate to rotate the resultant spin vectors through 90 degrees, the pulse is designated a 90 degree pulse. If the RF pulse or general magnetic field pulse is adequate to rotate the resultant spin vectors through 180 degrees, the parent pulse is termed a 180 degree pulse. After removal of the RF pulse, $T_1$ and $T_2$ relaxation occur. A portion of the absorbed energy is emitted as a signal which can be detected by receiver means 8.

In addition to the foregoing phenomena, it is contemplated that pulsed magnetic gradients will be applied along the X and Y axes. It will be appreciated that references herein to any of the X-Y-Z or X'-Y'-Z' axes are solely for purposes of relative reference and that any of the coordinate axes may be designated as normal to the slice and any of the prime coordinate axes may be designated as the axis of the main magnetic field with resultant corresonding changes in identification of the other axes. Moreover, for oblique imaging the logical Z axis is defined to be normal to the slice. In this case the logical X, Y and Z gradients will each be madeup of mixtures of the physical X, Y and Z gradients. Hereinafter reference to X, Y and Z gradients refers to these logical gradients.

In a manner which will be described hereinafter, at certain times during the pulse sequence, it may be desirable to impose pulsed magnetic gradients on the X or Y axes.

An initial 90 degree pulse 20 is applied to a specimen placed in the main magnetic field. Subsequently, at a time equal to one-half echo time $TE_1$, a refocussing pulse 24 which may be a 180 degree RF pulse is applied to the specimen. Pulse 24 creates echo 28 at a time period equal to one-half of $TE_1$ thereafter. At the time of this echo, a further 90 degree pulse 26 is imposed and converts the echo 28 into inverted longitudinal magnetization. Time period $TE_1$ is measured from the middle of pulse 20 to the middle of pulse 26 and is the time period between the initial 90 degree pulse and the creation of the echo 28 at pulse 26. Time period TI is the inversion time i.e., the time from the middle of the preparatory 90 degree pulse 26 to the middle of the 90 degree pulse 32 which begins the reading event or readout sequence. Subsequent to pulse 32 which is a 90 degree pulse, at a time equal to one-half echo time $TE_2$, a refocussing pulse 34 which may be a 180 degree RF pulse is generated and thereafter, at a time equal to one-half $TE_2$, a spin echo 36 occurs and a signal is emitted responsive to the refocussing pulse 34. $TE_2$ is the echo time from the middle of the initiating 90 degree pulse 32 to the peak of the resultant spin echo 36.

It will be appreciated that in the preferred practice the refocussing pulses 24 and 34 will be RF pulses substantially stronger and/or of longer duration than pulses 20, 26, 32 and 38, and preferably will be on the order of 180 degrees with the other pulses being 90 degrees. Pulse 20 may be in the range of about 70 to 110 degrees. Pulse 32 may be in the range of about 10 to 170 degrees if desired and refocussing RF pulses 24 and 34 can be replaced by refocussing gradient pulses.

Finally, after a period TD, a new cycle is begun by a 90 degree pulse 38. Time period TR is equal to the sum of $TE_1$, TI, $TE_2$ and TD. It will also be appreciated that multiple slices can be imaged by applying within this general sequence other RF and gradient pulses which are offset to affect and obtain information from other slices.

Several examples of the sequence in which the 90-180-90 pulse triplet of the present invention can be established will be considered. First of all, it is preferred that the triplet involves in-phase 90 degree pulses with a 180 degree pulse which is shifted 90 degrees out of phase and as a result, serving to drive the transverse magnetization down to the negative Z-axis direction. One sequence for pulses 20, 24, and 26 may have the 90 degree pulses imposed in a positive X'-direction, the 180 degree pulse imposed in a positive Y'-direction and the next 90 degree pulse imposed in a positive X'-direction. In the alternative, both of the 90 degree pulses can be in a positive X'-direction and the interposed 180 degree pulse in a minus Y' direction. Another approach would be to provide all of the pulses in an X'-direction with the first 90 degree pulse and the the 180 degree pulse being in a positive X'-direction and the second 90 degree pulse being in a minus X'-direction. A variation of this approach would be to have a 90 degree pulse in a positive X'-direction followed by a 180 degree pulse in the minus X'-direction and a 90 degree pulse in the minus X'-direction. It is assumed in these examples that the positive X'-direction is the direction of the first 90 degree pulse. The phases on pulses 32 and 34 can be arbitrarily set without adverse consequence. If in a given case the RF electronics and hardware allow arbitrary RF phases, the $90_{X'}$-$180_{Y'}$-$90_{X'}$ triplet can be replaced by a $90_{X'}$ followed by a 180 degree pulse with a phase alpha degrees away from Y', followed by a 90 degree pulse 2 alpha degrees away from X'. Similar variations can be made to the other three cases of RF phases set forth hereinbefore.

Considering further the sequence of pulses, 20, 24, 26, 32, 34 in FIG. 3, use of gradients in gaining information regarding spatial relationships will be considered. Gradients in the X and Y directions will generally be pulsed and be applied between pulse 32 and echo 36 and generally not during pulses 32 and 34. For example, a gradient along the X-axis may be imposed after termination of either 90 degree pulse 32 or 180 degree pulse 34. It will be appreciated that the RF pulse and gradient sequence provides a sequence which selects and images a slice or multiple slices of the specimen. As the pulse sequences of the present system are repeated, for example, 128 times, the strength of the gradients in the X and/or Y directions will be changed with successive cycles in order to provide meaningful information for imaging purposes. In general, within the gradient, the field strength will increase linearly with distance from the center. The nuclear moments within a slice of the specimen rotate in the transverse X'-Y' plane with a frequency which is proportional to the field strength within which they sit.

The X-axis may be employed as the frequency encoding axis from which signals relating to the high and low frequency portions may be provided in composite form and through Fourier Transformations be converted into a map of amplitude versus frequency. This permits a correlation between the X-coordinate of the signal and the frequency to be established.

Similarly, the Y-axis may be employed as the phase encoding axis. The varying moments under the influence of the Y-axis gradient can be employed to determine differences in gradient-induced phase oscillations between the high field region of the Y-gradient and the low field region of the Y-gradient. Fourier Transformations will provide the distribution of phase oscillation frequencies which can be related to positions along Y.

It will be appreciated that a principal feature of the present invention is the recognition of the numerous benefits which can be obtained from employing in inversion spin echo magnetic resonance imaging a pulse sequence of 90 degrees-180 degrees-90 degrees during an interval $TE_1$ approximately equal to $T_2$. Among the advantageous consequences of this approach are achieving cooperative $T_1$ and $T_2$ effects and obtaining $T_2$ effects without decreasing signal to noise ratios. All of this results in providing better contrast between tissues, better signal to noise ratios and shorter imaging times which may be on the order of at least one-half the prior times required for imaging both $T_1$ and $T_2$ effects.

Referring again to FIG. 3, there is shown an analog-to-digital converter (A/D) which converts the echo signal 36 into a digital signal 40 of corresponding magnitude which is introduced into the computer 12 (FIG 1). As a result of the RF pulse sequence employed herein, parallel $T_1$ and $T_2$ changes will produce parallel changes in pixel and voxel intensity to thereby provide image information which will establish an image of desired contrast.

In the representation shown in FIG. 3, a slice of the patient has been imaged and the Z, Y and X gradients are represented by the lines AGZ, IGY and IGX.

The Z gradient 50 is on during the selective 90 degree pulse 20 to cause pulse 20 to excite only a slice and not the entire volume. Dispersion of phase normal to the slice caused by gradient pulse 50 is compensated for by gradient 52 and serves to keep the signal maximal. Gradient 54 serves to cause selective 180 degree pulse 24 to affect only a slice. Gradient 56 causes the second selective 90 degree pulse 26 to affect only a slice. Alternatively, the inversion pulse triplet can be nonslice selective in the case of the RF and gradient profile given by the dashed line in FIG. 3. Gradient 56 is preferably left on a little longer than gradient pulse 50 in order to dephase any remaining transverse magnetization. Gradient 58 causes 90 degree pulse 32 in the readout part of the sequence to affect only a slice. Gradient 60 is similar in function to gradient 52, but compensates for gradient 58. Gradient 62 is similar to gradient 54 but is for 180 degree pulse 34 in the readout part of the sequence.

On the Y gradient line, 64 is the phase encoding Y gradient which induces phase shifts in the spin echo signal thereby enabling spatial encoding in the Y direction. Gradient pulse 66 compensates for the phase dispersion caused by gradient 64. Gradient pulses 64 and 66 are stepped in strength for each repetition of the pulse sequence. For three dimensional spatial encoding there are also stepped Z gradient pulses analogous to 64 and 66 (not shown).

On the X gradient line, 70 is an X gradient pulse which compensates for the phase dispersion due to X gradient 72. Frequency encoding gradient 72 causes the spin echo signal to have a spectrum of frequencies enabling spatial encoding in the X-direction.

The purpose of the compensation gradients of FIG. 3 are to keep the signal as large as it can be. A gradient causes certain regions of a slice to have a transverse magnetization which processes or rotates at a high frequency, while other regions precess at a low frequency. As the NMR signal is derived from the entire slice or volume, the summed nuclear magnetization signal will consist of hydrogen nuclei which precess at a range of frequencies while the gradient is on. When the gradient is turned off, the hydrogen nuclei will again all be at the same frequency, but will not be aligned or in phase as those that moved faster during the gradient are now ahead of the slower ones. This causes destructive interference in the signal. The compensation gradient essentially "refocusses" this phase dispersion in much the same way that the 180 degree pulse does in a spin echo and may be substituted therefor. The gradient is applied with reverse polarity so that the part of the slice that precessed at high frequency now precesses at a low frequency and vice-versa. If both the positive and negative gradient pulses are of equal time duration such as 64 and 66 on the Y axis, then when the compensation gradient is turned off all of the hydrogen signals will be aligned or in phase. If there is a 180 degree pulse between the dephasing (principal) gradient and the rephasing (compensation) gradient then the compensation gradient must have the same polarity as the principal gradient as in 70 and 72 in FIG. 3. As a practical matter the duration and/or strengths of the compensation gradients are preferably tuned to maximize signal. In general, phase encoding gradient 64 can be on at any time between the 90 pulse 32 and the beginning of A/D conversion 40 excluding the time that the RF pulses are on. Similarly, the X compensation gradient 70 can be on any time from the 90 degree pulse 32 to the beginning of the readout gradient 72 excluding the time that the RF pulses are on. If 70 is on after the 180 degree pulse 34, it must be of reverse polarity.

The preferred formula (Formula 1) for the magnetic gradient establishment of pixel intensity is:

$$I = KNe^{-TE_2/T_2}\{1 + e^{-TI/T_1}[(+e^{-TR/T_1} - 1)e^{-TE_1/T_2} - 1]\}$$

wherein:
I = the actual pixel intensity
N = density of sensitive nuclear spins in the sample
K = a scale factor based on electronics, slice thickness and the like This scale factor while not important for contrast serves to scale the entire image. It can be determined readily by measuring the signal (pixel) intensity of a "phantom" having a known spin density.

KN = the theoretical pixel intensity in the absence of RF pulses
$T_1$ = $T_1$ relaxation
$T_2$ = $T_2$ relaxation
TR = the repetition period for the entire cycle i.e. the sum of $TE_1$, TI, $TE_2$ and TD
TI = the inversion time i.e., the time from the middle of the second 90 degree pulse of the inversion pulse triplet that starts each sequence to the middle of the 90 degree pulse which begins the reading event
$TE_1$ = the echo time from the middle of the initiating 90 degree pulse to the peak of the spin echo which is converted to inverted longitudinal magnetization
$TE_2$ = the echo time from the middle of the 90 degree pulse beginning the reading event to the peak of the resultant spin echo.

In using this gradient pulse approach, the magnetic gradient pulses would be substituted for the RF pulse 34 and if desired the RF pulse 24 of FIG. 3. The magnetic gradient pulses if employed at 24 or 34 or both have the effect of a corresponding RF pulse. This Formula 1 also presents an approximation of the RF pulse approach, using 180 degree pulses at 24 and 34.

Figure 4:
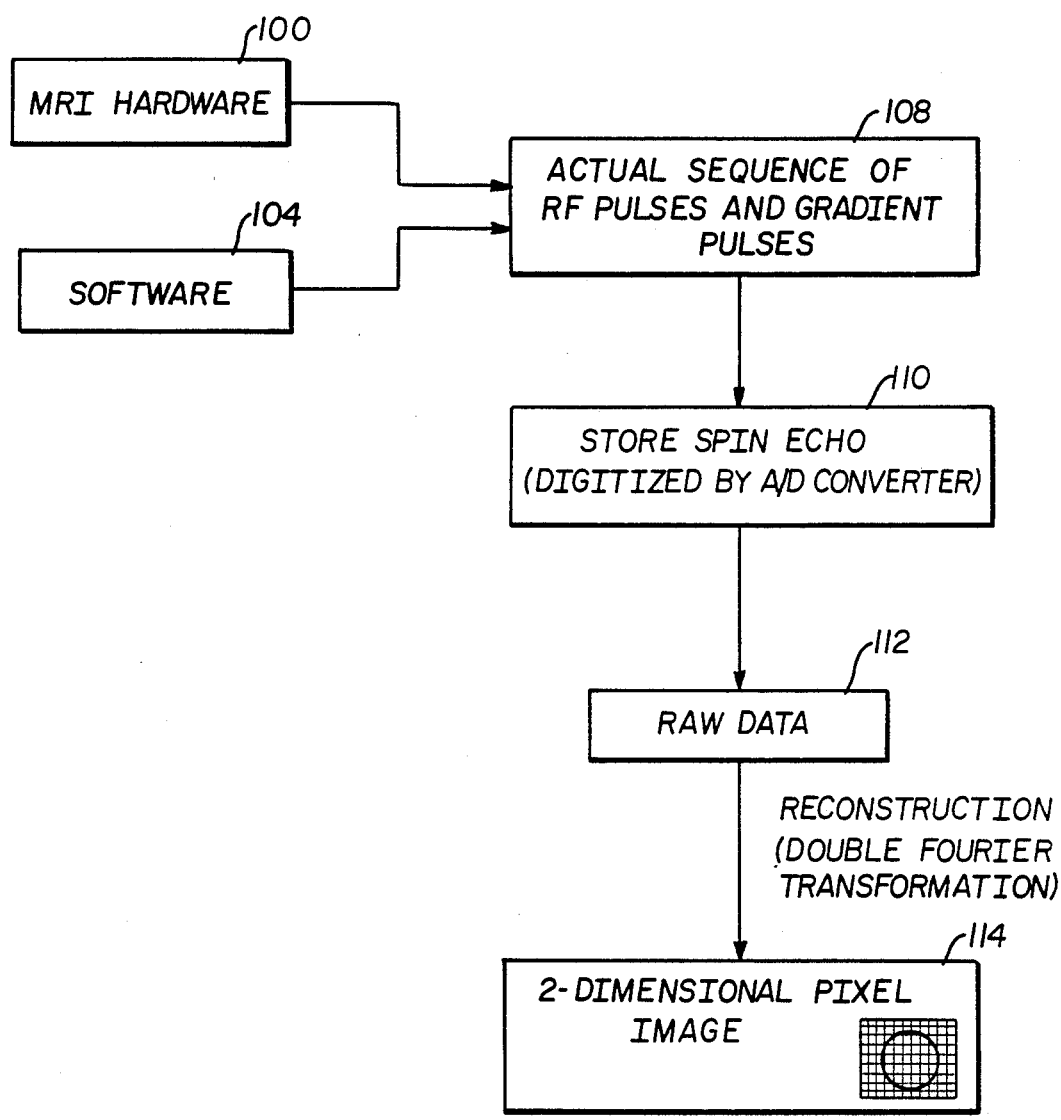
FIG. 4 is a schematic illustration of data generation and processing of the invention.

FIG. 4 shows in greater detail the handling of the signals in the current system. The magnetic resonance imaging equipment hardware 100, which may be of any desired form, cooperates with and is responsive to the pulse programming software 104 to generate the desired sequence of RF pulses and gradient pulses 108 as shown, for example, in FIG. 3. The signals, which have been digitized by the A/D converters, are then stored in a segment of the computer 110 and the scanning is repeated any desired number of times such as 128 times, for example, after which the raw data 112 is subjected to reconstruction through Fourier Transformations to create a map of frequency distribution with the two dimensional image 114 composed of individual pixels, for display.

A general relationship (Formula 2) of this invention which expresses a signal or pixel intensity of this system is:

$$I = KNe^{-TE_2/T_2}\{1 + e^{-TI/T_1}[(2e^{-(TD + \frac{1}{2}TE_2)/T_1} - e^{-(TD+TE_2)/T_1} - 1)e^{-TE_1/T_2} - 1]\}$$

wherein:
  I = the actual pixel intensity
  N = density of sensitive nuclear spins in the sample
  K = a scale factor based on electronics, slice thickness and the like This scale factor while not important for contrast serves to scale the entire image. It can be determined readily by measuring the signal (pixel) intensity of a "phantom" having a known spin density.

KN = the theoretical pixel intensity in the absence of RF pulses
  $T_1$ = $T_1$ relaxation
  $T_2$ = $T_2$ relaxation
  TD = the delay time from the peak of the acquired echo to the initiation of a new cycle initiated by a 90 degrees pulse i.e., the delay time necessary for $T_1$ recovery in order for another cycle to be initiated
  TI = the inversion time i.e., the time from the middle of the second 90 degree pulse of the inversion pulse triplet that starts each sequence to the middle of the 90 degree pulse which begins the reading event
  $TE_1$ = the echo time from the middle of the initiating 90 degree pulse to the peak of the spin echo which is converted to inverted longitudinal magnetization
  $TE_2$ = the echo time from the middle of the 90 degree pulse beginning the reading event to the peak of the resultant spin echo.

It will be appreciated from this relationship that the sign of the $e^{-TE_1/T_2}$ and $e^{-TI/T_1}$ terms make it apparent that $T_2$ sensitivity during the $TE_1$ interval cooperates with the $T_1$ sensitivity during the TI interval. It will be appreciated that $T_2$ sensitivity will be maximal and cooperative with $TE_1$ is approximately equal to $T_2$ and $TE_2$ is much less than $T_2$ while $T_1$ sensitivity will be maximal and cooperative when TI is approximately equal to $T_1$ and TD is much greater than $T_1$ and preferably about 2.5 to 4.0 times $T_1$. $TE_1$ may be about 0.25 to 4.0 times $T_2$ and preferably about equal to $T_2$. $TE_2$ is preferably less than about 0.25 times $T_2$.

Figure 5:
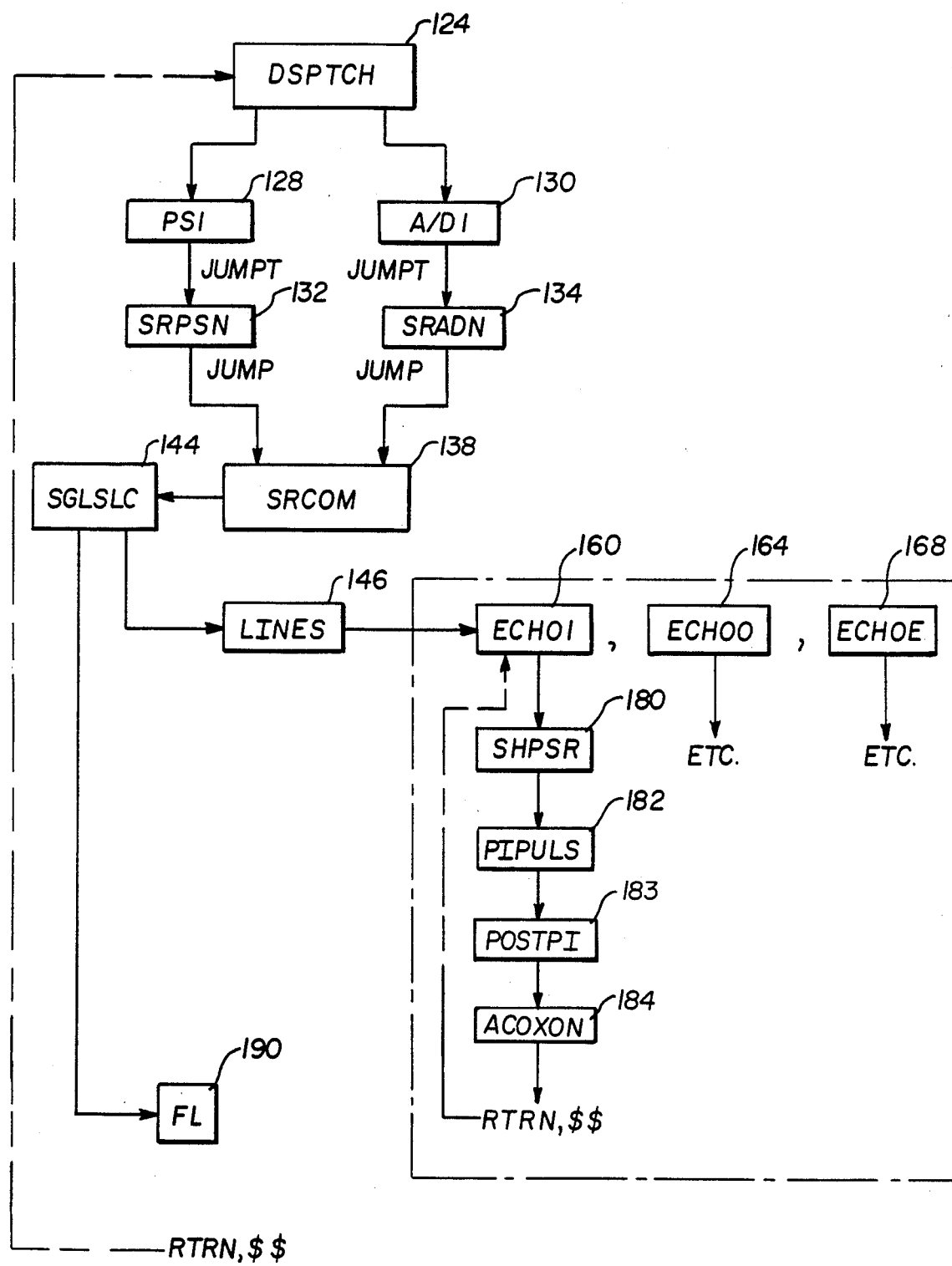
FIG. 5 is a flow diagram of a preferred form of software employable in the present invention.

Referring specifically to FIG. 5, there is shown a flow diagram of a form of the sequence employable in the software of the present invention. The dispatch function DSPTCH 124 establishes storage locations for the spin echo data and the phase of the receive coil i.e., the orientation in which the coil will detect the magnetization. This function is contained within lines 181 to 199 of the software listing which is provided hereinafter. Dispatch 124 send a control to PS1 128 (line 203) if the signal is the first signal for a given phase-encoding step ("pass mode") or sends a control signal to ADI 130 (line 207) if the signal is a later signal to be averaged with the previous signals for a given phase-encoding step ("add mode").

The term "JUMP⇌ always causes a jump as in a "GoTo" instruction. The optional use of the term "Jumpt" is employed only in studies gated to motion of the heart. The EKG would send a trigger that starts a sequence. The system may also be employed in a respiratory gating mode. SRPSN 132 receives signals from PS1 128. SRPSN 132 is employed for data acquisition in the pass mode. This codes for the saturation recovery or readout part of the sequence i.e., the entire $TE_2$ interval. SRADN 134 is employed for data acquisition in the add mode. A control ultimately passes to SRCOM (line 362–371) which calls the SGLSLC MACRO 144 (line 311) which in turn calls the LINES MACRO 146 (line 312). The LINES 146 calls the routine ECHO1 (lines 325–330), if the first echo is to be generated or calls ECHOO 164 or ECHOE 168 (lines 333–338) if a later echo in a multiecho sequence is to be generated. ECHOO 164 is called for later odd numbered echos and ECHOE 168 (lines 341–347) is called for later even numbered echos. Referring to FIG. 3 once again, echo 36 would be called for at ECHO1 160 as this is the first and only collected echo.

The ECHO1 routine 160 sequentially calls SHPSR 180 (lines 255–287) which sets up the 90 degree pulse and the waiting period between the 90 degree pulse and the 180 degree pulse. Routine SHPSR 180 in turn calls PIPULS 182 (lines 709–730) which sets up the slice selection gradient 62 and the 180 degree pulse 34. The program then returns to POSTPI 183 (lines 484–511) which fills out the sequence after the 180 degree pulse up to before the readout gradient pulse 72 and which finally calls ACOXON 184 (ACQXON, line 511) which sets up the A/D converter and the readout gradient pulse and acquires the spin echo. SGLSLC 144 then calls FL 190 which calls for the TD interval, the driven inversion pulse triplet (lines 733–832), and the TI interval. The program then returns to DSPTCH 124 (line 180) for the next repetition (either the next phase-encoding step of a further signal-average of the same phase-encoding step).

EXAMPLE

In order to provide further guidance as to certain preferred practices of the invention, several examples of actual tests employing the invention will be considered. By way of comparing the timing of the present invention with the conventional types of inversion spin echo magnetic resonance imaging, two 128-step processes were performed wherein 128 cycles of data were gathered without signal averaging.

Employing the preferred relationship of the present invention as set forth in Formula 2, $T_1$ was established at 700 milliseconds and $T_2$ was established at 80 milliseconds. $TE_1$ was established at 80 milliseconds, TI was 700 milliseconds, $TE_2$ was 30 milliseconds and TD was 2800 milliseconds (four times $T_1$). The total repetition time (TR) was 3610 milliseconds or 3.61 seconds. This equals approximately 7.7 minutes for a 128-step sequence which provides both $T_1$ and $T_2$ sensitivity.

By contrast, the conventional inversion spin echo magnetic resonance image would have TI, the time for the initial 180 degree pulse until the next 90 degree pulse at 700 milliseconds, TE the time from the 90 degree pulse to the echo at 30 milliseconds and TD the time from the echo to the next 180 degree pulse at 2800 milliseconds for a TR equal to 3530 milliseconds or 3.53 seconds. This converts to approximately 7.5 minutes for a 128-step sequence which provides only $T_1$ sensitivity. A further sequence to obtain $T_2$ sensitivity would be a spin echo sequence (90-180-echo-TD) repeat with TE=80 and TD=2800. The total repetition time (TR) was 2880 milliseconds or 2.88 seconds which equals 6.1 minutes for a 128-step sequence. The total time for $T_1$ and $T_2$ sensitive scans is 6.1 plus 7.5 = 13.6 minutes. This shows that the system of the present invention takes approximately one-half the time of the prior systems while providing equal or enhanced image contrast.

In order to disclose the best mode known to applicants for practicing the invention, a listing of the preferred software along with textual descriptions which indicate the significance of various segments of the software will be provided at this point. The computer means has logic means which controls the timing, signal processing, as well as operation of the magnetic fields and gradients and RF pulses.

Table of contents

```
     5- 179    Sequence through the data buffers
     6- 289    Single multislice acquisition pass
     7- 408    Single echo operations
```

```
                         Copyright  ©  Thomas E. Conturo
  2              ;Copyright (c) 1982,1983,1984,1985,1986
  3              ;          Technicare Corporation,  Solon, Ohio   44139
  4
  5              .Ident   /X002AZ/                ;M/N xxxxx
  6              ;Date    17-Mar-86               /JSM
  7
  8         ;+Table of contents
  9         ; This RF sequencer microprogram acquires Fourier reconstruction data
 10         ; for multislice , multiecho sequence.  Optionally, it may also be
 11         ; assembled for inversion recovery (IRSEG=1) and driven inversion
 12         ; spin echo (DISSEG=1) duty.
 13         ;-
 14         ;
 15         ; X001  FTDGRP   26-Jul-82  Russ Compton
 16         ; X001  FTSRIR.001 derived from FTDGRP.001    ,30-Sep-82 /Joe Malysa
 17         ; X001  Reassigned variables XI1,DL2, and XI2,06-Oct-82 /Joe Malysa
 18         ; X002  Modified everything              ,06-Oct-82 /Joe Malysa
 19         ; X002  Changed DL4 to XI2 & SGI placement  ,07-Oct-82 /Joe Malysa
 20         ; X002  modified the SGI interval for inversion part ,08-Oct-82 JM
 21         ;       Reversed the order of TDCEN & MCINIT ,28-Feb-83 /JSM
 22         ; X003  Added phase alternating on PI pulse   ,15-APR-83 /JSM
 23         ;       Added GRDTIM for support of geometry factors, 22-APR-83, JM
 24         ;
 25         ; X001  Renamed FTSRIR.003 to F2IT1.001             11-May-83 /JSM
 26         ;       Renamed F2IT1 TO F2I1GO                     18-May-83 /JSM
 27         ;       Dropped X comp for GRDTIM                   26-May-83 /JSM
 28         ;       Add cardiac gating capability               06-Jun-83 /JSM
 29         ;       Added a 180 pulse for saturation part       29-Jun-83 /JSM
 30         ; X002  Add T2 capability so that it will do T1 & T2. 01-Nov-83 /JSM
 31         ; X001  Rename to FMMEGO.001 and add multislice     22-Nov-83 /JSM
 32         ;       capability.
 33         ; X002  Rework with computed delay times,           10-Jan-84 /RAC
 34         ;       optional inversion recovery support
 35         ; X003  Use AXCO based dispatch routine, computed GOTO  17-Jan-84 /RAC
 36         ;       for acquisition mode
 37         ; X004  Hook up gating                              25-Jan-84 /RAC
 38         ; X005  Two subroutine LINES call form .            08-Feb-84 /RAC
 39         ;       Hook up physiological gate delay            18-Feb-84 /RAC
 40         ;       Turn off pi pulse selection grads if DL5 <0  19-Feb-84 /RAC
 41         ;       Add RTRN,$$ in SGLSLC macro for IR case     09-Mar-84 /JSM
 42         ;       Reconditionalize SGLSLC macro               10-Mar-84 /RAC
 43         ;       Add JSM GRDRST instruction in resp gate warmup 19-Mar-84 /RAC
 44         ; X006  Recalculate phys gate inhibit time,
 45         ;       bias coil multislice                        19-Mar-84 /RAC
 46         ;       Conditional sin(x)/x pi pulse               27-Mar-84
 47         ; X007  Add constant frequency shift FKMSEG option  28-Aug-84 /JSM
 48         ;       Add Gating micro interface where MC1<14:12> =1  24-Sep-84 /JSM
 49         ;          indicates that the gating micro is present.
 50         ;------------------------------------------------------------------
 51         ; X001 Rename from fmmeg0.007 to fmmex0.001 and     29-Mar-85 /JSM
 52         ;                 add DL19 & DL20 PI SHIFTS,
 53         ;                 add DL5 for AZG warm up,
 54         ;                 add real-time gaussian,sinc,wow shapes
 55         ;       Make the WOW pulse conditional assemblies   04-Apr-85 /JSM
 56         ;       Use    MC1<9:9>:1 to suppress 90 (XW2)  AZG 12-May-85 /JSM
 57         ;       and MC1<10:10>:1 to suppress refocusing 180 (XW1) AZG
 58         ;       and MC1<11:11>:1 to suppress inversion 180  (XW3) AZG
 59         ;       and MC1<8:6> for GAUS,SINC,WOW for Inversion (XW3) pulse
 60         ;       & fix PSGDLY with DL5 instead of AZGDLY.
 61         ;       Use MC1<12:12> instead of MC1<14:12> for presence 15-May-85 /JSM
 62         ;                 of gating micro /JSM
 63         ;
 64         ;       Switch MC1<10:10> and MC1<9:9>              04-Jun-85 /JSM
 65         ;------------------------------------------------------------------
 66         ;
 67         ; X002 Rename from FMMEX0.001 to FMMEX0.002 with    05-Nov-85 /Dave Sebok
 68         ;       performance upgrade changes:
 69         ;       1. Replace pre-PI IYG pulse with inverted post PI IYG pulse.
 70         ;       2. Add inverted IYG pulses after 2nd thru nth PI pulses.
 71         ;       3. Change SDL to DL11 for IXGC pulse.
 72         ;       4. Change SDL to DL10 for IXG pulses.
 73         ;       5. Change AZGC pulse width from XW2 to DL2.
 74         ;------------------------------------------------------------------
 75         ;       Fix ISE logic                               22-Jan-86 /JSM
 76         ;       Use DL11,DL10 instead of DL11 for xcomp     17-Mar-86 /JSM
 77         ;
 78         ;------------------------------------------------------------------
```

```
 79      ;
 80      ; X001 Rename from FMMEX0.002 to FMMEX1.001         30-Jun-86 /Tom Conturo
 81      ;       for assembly of the driven inversion spin echo (DISE) sequence.
 82      ;       To assemble this code, type @RFSEQ.MO7 FMMEX1.001 DISSEQ.
 83      ;       This will conditionally compile the DISE sequence (the IRSEQ
 84      ;       switch is automatically set to 1 because the DISE code is a
 85      ;       conditional of the inversion recovery (ISE) code.
 86      ;       In this case, use either the DISSEQ switch alone, or the DISSEQ
 87      ;       switch and the IRSEQ switch.
 88      ;       The TE is used as in the ISE, the TI starts after the driven
 89      ;       inversion, and DL15 is used for the echo time of the driven
 90      ;       inversion.  DL16 is used for the dephasing time after the driven
 91      ;       inversion (the time that the slice selection gradient is left on).
 92      ;
 93      ;       Use MC1<11:11>:1 to suppress all driven inversion slice selection
 94      ;       (just like it is used to supress the pi-inversion slice selection).
 95      ;       This will also specify hard pi/2 and pi pulses in the driven
 96      ;       inversion triplet (RFPULS will be called instead of SHPRFP).
 97      ;       This MC1 selection is chosen to specify the hard pulses because,
 98      ;       unlike the simple ISE sequence, there is not separate control of
 99      ;       the inversion pulse using XW3, XA3, etc.  This option should
100      ;       only be used for single slice acquisitions, and will probably give the
101      ;       best inversion since the time of the pi/2 inverting pulse should be
102      ;       much shorter than the duration of the echo.  (Note, later this still may
103      ;       be done in a multislice mode by incrementing the TI interval for each
104      ;       acquired slice.  Also, gradient echoes may later be programmed to
105      ;       acquire data so that there is less competing T2 sensitivity.  At any
106      ;       rate, in a single slice mode, hard inverting pulses can be specified
107      ;       using mc1<9:9>:1 so that shorter echo times can be used without using
108      ;       gradient echoes.
109      ;
110      ; X001  Rename from FMMEX1.001 to FDISE0.001          14-Jul-84 /Tom Conturo
111      ;       for clarity.  Rewrote to use XW3, XA3, and XA3
112      ;       as parameters for the pi pulse of the inverting pulse triplet.  The
113      ;       attenuation offest is then set at 0.5 for the pi/2 pulse.  This will
114      ;       allow tuning of the hard inverting triplet separate from tuning of the
115      ;       soft pi/2 and pi (this is much better than programming in the T3 usec
116      ;       duration since this would require recompiling for every tuning update).
117      ;       The composite inverting pulse is called with RFPULS instead of
118      ;       SHPRFP since SHPRFP does not have provisions for a width scale factor.
119      ;-----------------------------------------------------------------------
120      ;
121
122
123              .IIF NDF MCLIST,MCLIST=0         ;Don't force listting
124              .IIF NDF NECHO,NECHO=8.          ;Maximum number of echoes
125              .IIF NDF NSLICE,NSLICE=16.       ;Maximum number of slices
126              .IIF NDF ALTERN,ALTERN=1         ;Alternate phase for successive buffers
127              .IIF NDF IRSEQ,IRSEQ=1           ;Inversion recovery version (needed for
128                                               ; DISE sequence).
129              .IIF NDF DISSEQ,DISSEQ=1         ;Driven Inversion version (so default is
130                                               ; the DISE sequence. To get irseq, enter
131                                               ; DISSEQ=0.  To get SE sequence, enter
132                                               ; IRSEQ=0, DISSEQ=0. )
133
134
135              .IIF NDF BCLMS,BCLMS=0           ;Not bias coil multislice
136              .IIF NDF SINCPI,SINCPI=0         ;Gaussian pi pulse, not sin(x)/x
137              .IIF NDF FKSEQ,FKSEQ=0           ;Not cons. freq. multislice
138              .IIF NDF WOWRF,WOWRF=0           ;If WOWRF not defined then don't assemble it
139              UNGATD=0                         ;Ungated mode
140              CARDGT=1                         ;Cardiac gating mode
141
142      ; Reset the transmitter and declare start of gradient sequence
143 0000         MCINIT                           ;Initialize the RF system
144 0002         ... <GRADS <X,0.0>,<Y,0.0>,<Z,0.0>>,$$ ;Reset the gradients to zero
145
146 0003         TDCEN   Y                        ;Time domain centered data
147 0003         MESEQ   Y                        ;Supports multiecho acquisition
148 0003         .IIF EQ BCLMS,FMSSEQ Y           ;Frequency shift multislice sequence
149 0003         .IIF NE IRSEQ,IRISEQ Y           ;Set IR sequence type flag
150              .IIF NE FKSEQ,FKMSEQ Y           ;Cons. freq. shift multislice
151 0003         GRDTIM  <<X,SMI>,<Y,DL1>>        ;Gradient time specifications for
152 0003         GRDTIM  <<Z,DL2>>                ;  geometry info to NMRBLD
153 0003         .IIF EQ BCLMS,ZRFGOF Z,1.0,AUX   ;Calculate frequency range per Z range
154
155      ; Precalculate half of the total sampling time
156              .LIST   OCT
157 000000      .TSECT  SADJID                    ;Impure storage
158 000000 HSAMTM: .BLKL                          ;Half of one line's sampling time (FPU I*4)
159 000004 PREPI:  .BLKE
160 000010 POSPI:  .BLKE
161 000014 PADLY:  .BLKE
162
163 000020      CALC    HSAMTM,<<SMI,NSM,0.5>>    ;For use later
164 0010        CALC    PREPI,<DL5,<XW2,0.5>,<XW1,0.5>>
165 0010        CALC    POSPI,<DL10,HSAMTM,<XW1,0.5>>
166 0010        CALC    PADLY,<DL5,DL6,<XW2,0.5>>
167
168              .LIST   HEX
169 0003        .TSECT  SEGADR
170
171      ;; Fill out the timing for the mop'd acquisition paths
```

```
172              ;      ... <IFLEB <PGT,CARDGT>,<JUMP 206>>,%% ;Jump around if not resp or comb
173              ;      ... <JSUB 106>,%%                       ;Simulate call from DSPTCH
174              ;106:  ... <JSUB SRNOAND>,%%                   ;There will be two things on the stack
175              ;      ... GRDRST,%%                           ;Reset the gradients again
176              ;      ... <JMPOP 206>,%%                      ;Clean off the 1st return address
177              ;206:
Sequence through the data buffers 179                     .Shttl  Sequence through the data buffers
180     0003    AGAIN:   DSPTCH PS1,AD1,AD1R,GRDRS,+            ;Acquire buffer #1
181     001D    ...     <BUFFIN 1>,%%                           ;Signal that buffer #1 is complete
182     0022    ...     CONT,%%                                 ;Timing fill
183                     .IF NE ALTERNATEY
184     0023             DSPTCH PS2,AD2,AD2R,GRDRS,-            ;Acquire buffer #2 with inverted signal
185                     .IFF
186                      DSPTCH PS2,AD2,AD2R,GRDRS,+            ;Acquire buffer #2
187                     .ENDC
188     003D    ...     <BUFFIN 2>,%%                           ;Signal that buffer #2 is complete
189     0042    ...     CONT,%%                                 ;Timing fill
190     0043             DSPTCH PS3,AD3,AD3R,GRDRS,+            ;Acquire buffer #3
191     005D    ...     <BUFFIN 3>,%%                           ;Signal that buffer #3 is complete
192     0062    ...     CONT,%%                                 ;Timing fill
193                     .IF NE ALTERNATEY                       ;If alternate buffers are inverted
194     0063             DSPTCH PS4,AD4,AD4R,GRDRS,-            ;Acquire buffer #4 with inverted signal
195                     .IFF
196                      DSPTCH PS4,AD4,AD4R,GRDRS,+            ;Acquire buffer #4
197                     .ENDC
198     007D    ...     <BUFFIN 4>,%%                           ;Signal that buffer #4 is complete
199     0082    ...     <JUMP AGAIN>,EOS,%%                     ;and do it all again
200
201
202             ; Collect buffer #1 data in pass mode with normal phase pi pulses
203     0083    PS1:     ACQ1KI 1,1                             ;Set up buffer #1, group #1
204     0085             GATE <JUMPT SRPSND,<JSUB SRNOAND>,GRDRS    ;Gate and acquire
205
206             ; Collect buffer #1 data in add mode with normal phase pi pulses
207     008A    AD1:     ACQ1KI 1,1                             ;Set up buffer #1, group #1
208     008C             GATE <JUMPT SRADND,<JSUB SRNOAND>,GRDRS    ;Gate and acquire
209
210             ; Collect buffer #1 data in add mode with inverted pi pulses
211     0091    AD1R:    ACQ1KI 1,1                             ;Set up buffer #1, group #1
212     0093             GATE <JUMPT SRADI>,<JSUB SRNOAI>,GRDRS    ;Gate and acquire
213
214
215                     .IF NE ALTERNATEY                       ;Alternate phase Y mode
216
217             ; Collect buffer #2 data in pass mode with inverted pi pulses
218     0098    PS2:     ACQ1KI 1,2                             ;Set up buffer #2, group #1
219     009A             GATE <JUMPT SRPSI>,<JSUB SRNOAI>,GRDRS    ;Gate and acquire
220
221             ; Collect buffer #2 data in add mode with inverted pi pulses
222     009F    AD2:     ACQ1KI 1,2                             ;Set up buffer #2, group #1
223     00A1             GATE <JUMPT SRADI>,<JSUB SRNOAI>,GRDRS    ;Gate and acquire
224
225             ; Collect buffer #2 data in add mode with normal phase pi pulses
226     00A6    AD2R:    ACQ1KI 1,2                             ;Set up buffer #2, group #1
227     00A8             GATE <JUMPT SRADND,<JSUB SRNOAND>,GRDRS    ;Gate and acquire
228
229                     .IFF
230
231             ; Collect buffer #2 data in pass mode with normal phase pi pulses
232             PS2:     ACQ1KI 1,2                             ;Set up buffer #2, group #1
233                      GATE <JUMPT SRPSND,<JSUB SRNOAND>,GRDRS    ;Gate and acquire
234
235             ; Collect buffer #2 data in add mode with normal phase pi pulses
236             AD2:     ACQ1KI 1,2                             ;Set up buffer #2, group #1
237                      GATE <JUMPT SRADND,<JSUB SRNOAND>,GRDRS    ;Gate and acquire
238
239             ; Collect buffer #2 data in add mode with inverted phase pi pulses
240             AD2R:    ACQ1KI 1,2                             ;Set up buffer #2, group #1
241                      GATE <JUMPT SRADI>,<JSUB SRNOAI>,GRDRS    ;Gate and acquire
242
243                     .ENDC
244
245
246             ; Collect buffer #3 data in pass mode with normal phase pi pulses
247     00AD    PS3:     ACQ1KI 1,3                             ;Set up buffer #3, group #1
248     00AF             GATE <JUMPT SRPSND,<JSUB SRNOAND>,GRDRS    ;Gate and acquire
249
250             ; Collect buffer #3 data in add mode with normal phase pi pulses
251     00B4    AD3:     ACQ1KI 1,3                             ;Set up buffer #3, group #1
252     00B6             GATE <JUMPT SRADND,<JSUB SRNOAND>,GRDRS    ;Gate and acquire
253
254             ; Collect buffer #3 data in add mode with inverted phase pi pulses
255     00BB    AD3R:    ACQ1KI 1,3                             ;Set up buffer #3, group #1
256     00BD             GATE <JUMPT SRADI>,<JSUB SRNOAI>,GRDRS    ;Gate and acquire
257
258
259                     .IF NE ALTERNATEY
260
261             ; Collect buffer #4 data in pass mode with inverted phase pi pulses
262     00C2    PS4:     ACQ1KI 1,4                             ;Set up buffer #4, group #1
263     00C4             GATE <JUMPT SRPSI>,<JSUB SRNOAI>,GRDRS    ;Gate and acquire
```

```
264
265             ; Collect buffer #4 data in add mode with inverted phase pi pulses
266   00C9  AD4:        ACQ1KI  1,4                              ;Set up buffer #4, group #1
267   00CB        GATE <JUMPT SRADI>,<JSUB SRNOAI>,GRDRS        ;Gate and acquire
268
269             ; Collect buffer #4 data in add mode with normal phase pi pulses
270   00D0  AD4R:       ACQ1KI  1,4                              ;Set up buffer #4, group #1
271   00D2        GATE <JUMPT SRADN>,<JSUB SRNOAN>,GRDRS        ;Gate and acquire
272
273                   .IFF
274
275             ; Collect buffer #4 data in pass mode with normal phase pi pulses
276         PS4:        ACQ1KI  1,4                              ;Set up buffer #4, group #1
277               GATE <JUMPT SRPSN>,<JSUB SRNOAN>,GRDRS        ;Gate and acquire
278
279             ; Collect buffer #4 data in add mode with normal phase pi pulses
280         AD4:        ACQ1KI  1,4                              ;Set up buffer #4, group #1
281               GATE <JUMPT SRADN>,<JSUB SRNOAN>,GRDRS        ;Gate and acquire
282
283             ; Collect buffer #4 data in add mode with inverted phase pi pulses
284         AD4R:       ACQ1KI  1,4                              ;Set up buffer #4, group #1
285               GATE <JUMPT SRADI>,<JSUB SRNOAI>,GRDRS        ;Gate and acquire
286
287                   .ENDC
288                   .Sbttl  Single multislice acquisition pass
289
290             ; Set up acquisition and inversion pulse phase mode
291
292   00D7  SRPSN:  ... <LOAD AXCO,1+-4>,$$      ;Mode 1 is pass, normal pi pulses
293   00D8         ... <JUMP SRCOM>,$$
294
295   00D9  SRPSI:  ... <LOAD AXCO,2+-4>,$$      ;Mode 2 is pass, inverted pi pulses
296   00DA         ... <JUMP SRCOM>,$$
297
298   00DB  SRADN:  ... <LOAD AXCO,3+-4>,$$      ;Mode 3 is add, normal pi pulses
299   00DC         ... <JUMP SRCOM>,$$
300
301   00DD  SRADI:  ... <LOAD AXCO,4+-4>,$$      ;Mode 4 is add, inverted pi pulses
302   00DE         ... <JUMP SRCOM>,$$
303
304   00DF  SRNOAN: ... <LOAD AXCO,5+-4>,$$      ;Mode 5 is discard, normal pi pulses
305   00E0         ... <JUMP SRCOM>,$$
306
307   00E1  SRNOAI: ... <LOAD AXCO,6+-4>,$$      ;Mode 6 is discard, inverted pi pulses
308   00E2         ... <JUMP SRCOM>,$$
309
310             ; Define a single slice operation
311                   .MACRO  SGLSLC  X,SLICE
312                   LINES NECHO,<ECHO1 SLICE,>,<ECHOO SLICE,>,<ECHOE SLICE,>,FALLTHROUGH,1
313                   .IF NE IRSEQ              ;If inversion recovery version
314                   .IF NE BCLMS              ;If bias coil multislice
315               ... <JSUB FL>,$$              ;Insert inversion pulse
316                   .IFF
317               ... <JSUB FQIR'SLICE'>,$$     ;Insert inversion pulse
318                   .ENDC
319                   .IFF
320               ... <JSUB FL>,$$              ;Fill interslice time
321                   .ENDC
322                   .ENDM   SGLSLC
323
324             ; Define a first echo operation
325                   .MACRO  ECHO1   SLICE,ECHO
326                   .IF EQ BCLMS              ;If frequency shift multislice
327               ... <JSUB FQSY'SLICE>,$$
328                   .ENDC
329               ... <JSUB SHPSR>,$$           ;Do 1st echo
330                   .ENDM   ECHO1
331
332             ; Define an odd echo operation
333                   .MACRO  ECHOO   SLICE,ECHO
334                   .IF EQ BCLMS              ;If frequency shift multislice
335               ... <JSUB FQSY'SLICE>,$$
336                   .ENDC
337               ... <JSUB ODECHO>,$$          ;Do echos 3, 5, 7, etc
338                   .ENDM   ECHOO
339
340             ; Define an even echo operation
341                   .MACRO  ECHOE   SLICE,ECHO
342                   .IF EQ BCLMS              ;If frequency shift multislice
343               ... <JSUB FQSY'SLICE>,$$
344                   .ENDC
345               ... <JSUB EVECHO>,$$          ;Do echos 2, 4, 6, etc
346                   .ENDM   ECHOE
347
348             ; Calculate the post SGI phys gate fill time
349                   .LIST   OCT
350   000020        .TSECT  $ADJID
351   000020  PSGDLY: .BLKL                     ;Post SGI phys gate inhibit time
352
353                   .IF NE BCLMS              ;If bias coil multislice
354                   CALC PSGDLY,<PGINHT,<-1,PGDLY1>,<-1,SGI>,<0.5,XW2>,DL5,5>
355                   .IFF
356   000024        CALC PSGDLY,<PGINHT,<-1,PGDLY1>,<-1,SGI>,<0.5,XW2>,DL5,7>
357                   .ENDC
```

```
358
359                     .LIST   HEX
360     00E3            .TSECT  SEGADR
361
362     00E3    SRCOM:  CASJMP 20$                      ;If gating enabled and software phy delay
363     00E3            CASJMP ,<<10$,<<PGT,NE,UNGATD>,<<<MC1,(12:12)>>,EQ,0>>>>
364     00E3                    $$
365             ;;      ... <CASJMP 20$,<<10$,<<PGT,NE,UNGATD>>>>>,$$  ;Skip if not gated study
366     00E4    10$:    .IF NE  BCLMS                   ;If bias coil multislice
367                     WTFOR <PGDLY1,<XW2,-0.5>,<DL5,-1.0>,-5>,,,EPGDUV ;Wait for phys gate delay
368                     .IFF
369     00E4            WTFOR <PGDLY1,<XW2,-0.5>,<DL5,-1.0>,-7>,,,EPGDUV ;Wait for phys gate delay
370                     .ENDC
371     00EB    20$:    MRKTIM 1                        ;Mark beginning of 1st slice
372     00EB            SLICES NSLICE,<SGLSLC>,1,+1,-10,,30$ ;Run through various slices
373
374     01FC    30$:    CASJMP 50$                      ;The default is no post fill
375     01FC            CASJMP,,<<40$,<<PGT,NE,UNGATD>,<PSGDLY,GT,0.0>,<<<MC1,(12:12)>>,EQ,0>>>>
376     01FC                    $$
377     01FD    40$:    WTFOR PSGDLY,-1                 ;Insert postfill
378     0204    50$:    ... RTRN,$$                     ;Do next phase
379
380
381                     .IF EQ  BCLMS                   ;If frequency shift multislice
382
383             ; Prepare frequency for selected slice
384                     .MACRO  FREQ    SLICE
385             FGSY'SLICE:
386                     SLCFRQ  SLC=SLICE,GRP=0,EXIT=RTRN
387                     .ENDM   FREQ
388
389             ; Prepare frequency for inversion pulse
390                     .MACRO  FREQIR  SLICE
391             FGIR'SLICE';
392                     SLCFRQ  SLC=SLICE,GRP=1
393                     ... <JUMP FL>,$$
394                     .ENDM
395
396             ; Set up utility routines needed for each slice
397                     N=1
398                     .REPT NSLICE
399                     FREQ    \N                      ;Set up slice frequency
400                     .IF NE  IRSEG
401                     FREQIR  \N                      ;Inversion pulse frequency
402                     .ENDC
403                     N=N+1
404                     .ENDM
405
406                     .ENDC
408                     .Sbttl  Single echo operations
409
410             ; Make the pi/2 pulse
411     0255    SHPSR:
412     0255            CASJMP 1$                       ;If suppressed slice selection
413     0255            CASJMP ,<<2$,<<<<MC1,(10:10)>>,EQ,0>>>>
414     0255                    $$
415     0256    1$:     ... <JUMP 3$>,$$                ;Timing fill
416     0257    2$:     GRADS <X,1.0,AUX>               ;Turn on the slice selection gradient
417     0257                    GRADS <Y,1.0,AUX>       ;
418     0257                    GRADS <Z,1.0,AUX>       ;
419                     .IF NE  BCLMS                   ;If bias coil multislice
420                     GRADS <ZRANGE,,0>               ;Offset group 0 bias
421                     .ENDC
422     0257                    $$
423     0258            WTFOR <DL5,-1>,-1               ;Warm up for 2 milliseconds
424     025F    3$:
425     025F            SHPRFP MC(5:3),XW2,XA2
426     0264            ... <JUMP 40$>,$$               ;
427
428     0265    40$:    MRKTIM 2                        ;Mark the pi/2 finish time
429     0265            GRADS <X,1.0,IMG,COR>           ;Turn on the X dephasing gradient
430     0265                    GRADS <X,1.0,AUX,COR>   ;and the X refocusing gradient
431     0265                    GRADS <Y,1.0,AUX,COR>   ;and the Y refocusing gradient
432     0265                    GRADS <Z,1.0,IMG>       ;and the Z phase encoding gradient
433     0265                    GRADS <Z,1.0,AUX,COR>   ;and the Z refocusing gradient
434                     .IF NE  BCLMS                   ;If bias coil multislice
435                     GRADS <ZRANGE,,0>               ;Offset group 0 bias
436                     .ENDC
437     0265                    $$
438
439
440             ; Set up a series of delays to control the X imaging dephasing gradient,
441             ; the Y phase encoding gradient, the Z phase encoding gradient, and the
442             ; the slice selection compensation gradient.
443
444                     .LIST   OCT
445     000024          .TSECT  $ADJID
446     000024  XCDLY:  .BLKL                           ;X compensation gradient time
447
448     000030          CALC    XCDLY,<DL10,DL11,HSAMTM,<BMI,-0.5>>      ;Precalculate it
449
450                     .LIST   HEX
```

```
451     0266            .TSECT  SEGADR
452
453             ; Wait until the shortest delay time has elapsed
454     0266            WFRMIN <XCDLY,DL2>,2,-2     ;Relative to end of the pi/2 pulse
455
456             ; Set up next gradient state.  Find which gradients change first
457     026D            CASJMP 20$                  ;The residue is X dephasing off first
458     026D              CASJ2V DL2,XCDLY          ;Check Z phase encoding cases
459     026D              CASJ2A L1=10$,L12=30$
460     026D              $$
461
462             ; Leave on the X dephasing gradient
463     026E    10$:    ... <GRADS <X,1.0,IMG,COR>>,$$  ;X
464     026F            WTFOR <XCDLY,-2.>,2
465     0274            ... <JUMP 30$>,$$               ;Now everything off
466
467             ; Leave on the Z phase encoding and the slice refocusing gradients
468     0277    20$:    GRADS <X,1.0,AUX,COR>       ;X
469     0277              GRADS <Y,1.0,AUX,COR>     ;Y
470     0277              GRADS <Z,1.0,AUX,COR>     ;Z
471     0277    ... <GRADS <Z,1.0,IMG>>,$$
472     0278            WTFOR <DL2,-2.0>,2
473
474             ; All gradients now off
475     027F    30$:;   GRADS <X,0.0>               ;X
476             ;       GRADS <Y,0.0>               ;Y
477     027F    ... <GRADS <Z,0.0>>,$$              ;
478
479             ; Wait til time to turn on the slice selection for the 1st pi pulse
480     0280            WTFOR <<TE,0.5>,<PREPI,-1.0>,<DL19,1.0>,-3>,2
481     0287    ... <JSUB PIPULSE>,$$               ;Turn on the gradients, wait
482                                                 ; for the pulse, then do it
483
484     0288    POSTPI: MRKTIM 4                    ;Mark end of the acquisition + 5 usec
485             ;Turn on y phase encoding gradients
486     0288            GRADS <X,1.0,AUX>           ;Leave on the X imaging gradient
487     0288              GRADS <Y,1.0,AUX>         ;and the Y
488     0288              GRADS <Y,-1.0,IMG>        ;and the Y
489     0288    ... <GRADS <Z,1.0,AUX>>,$$          ;Turn off the Z
490     0289            WFRMIN <PADLY,DL1>,4,-2     ;Wait for the shorter of X and Y
491     0290            CASJMP 20$                  ;Residue is Y phase encoding off first
492     0290              CASJ2V PADLY,DL1          ;Check X dephasing
493     0290              CASJ2A L1=10$,L12=30$
494     0290              $$
495
496             ; Y imaging gradient is still on
497     0291    10$:    ... <GRADS <Y,-1.0,IMG>>,$$ ;Leave on the Y
498     0292            WTFOR <DL1,-2.>,4           ;Wait for Y
499     0299    ... <JUMP 30$>,$$                   ;Now turn it off
500
501             ; X imaging gradient is still on
502     029A    20$:    GRADS <X,1.0,AUX>           ;Leave on the X imaging gradient
503     029A              GRADS <Y,1.0,AUX>         ;Turn off the Y if necessary
504     029A    ... <GRADS <Z,1.0,AUX>>,$$          ;Ditto Z
505     029B            WTFOR <PADLY,-1>,4          ;Wait for the X interval
506
507             ; Turn off all gradients and wait til time to turn on the Z slice
508             ;    selection gradient
509     02A2    30$:    ... <GRADS <Z,0.0>>,$$      ;Everything off
510     02A3            WTFOR <TE,<XW2,-0.5>,<HSAMTM,-1.0>,<SMI,0.5>,<DL10,-1.0>,-1>,2
511     02AA    ... <JUMP ACQXOND>,$$               ;Turn on X imaging gradient and acquire
512
513
514             ; Precompute the post acquisition time delays
515                     .LIST   OCT
516     000030          .TSECT  $ADJID
517     000030  PXODLY: .BLKE                       ;Post odd echo X dephasing
518     000034  PXEDLY: .BLKE                       ;Post even echo X dephasing
519     000040  PYDLY:  .BLKE                       ;Y double phase encoding
520     000044  PZDLY:  .BLKE                       ;Z double phase encoding
521
522     000050          CALC    PXODLY,<DL10,DL9,<DL8,-1.0>,-6.>
523     0028            CALC    PXEDLY,<DL10,DL9,DL8,-6.>
524     0028            CALC    PYDLY,<DL1,DL3>
525     0028            CALC    PZDLY,<DL2,DL4>
526
527                     .LIST   HEX
528     02AB            .TSECT  SEGADR
529
530             ; Acquire a secondary odd echo.  Continue dephasing the X signal
531             ; and reverse phase the Y and Z signals
532     02AB    ODECHO: MRKTIM 4                    ;Mark end of the acquisition + 5 usec
533     02AB            GRADS <X,1.0,IMG>           ;Leave on the X imaging gradient
534     02AB              GRADS <Y,1.0,IMG,COR>     ;Turn on the Y imaging correction gradient
535     02AB    ... <GRADS <Z,1.0,IMG,COR>>,$$ ;Ditto Z
536
537             ; Service the shortest post acquisition gradient interval
538     02AC            WFRMIN <PXODLY,PYDLY,PZDLY>,4,-2
539     02B3            CASJMP 20$                  ;The residue is Z phase encoding off first
540     02B3              CASJ3V PXODLY,PYDLY,PZDLY ;Check X dephasing first
541     02B3              CASJ3A L1=30$,L12=50$,L13=40$,L123=70$
542     02B3              CASJ3V PYDLY,PZDLY,PXODLY ;Check Y phase double coding next
```

```
543   02B3                      CASJ3A L1=10$,L12=60$,L13=50$,L123=70$
544   02B3                      $$
545
546          ; Y imaging compensation gradient terminates first
547   02B4   10$:     GRADS <X,1.0,IMG>           ;Leave on the X imaging gradient
548          ;        GRADS <Y,0.0>               ;Turn off Y
549   02B4   ...      <GRADS <Z,1.0,IMG,COR>>,$$  ;Leave on the Z
550   02B5            WFRMIN <PXODLY,PZDLY>,4,-2  ;Wait for shorter of X and Z
551   02BC            CASJMP 60$                  ;Residue is Z phase encoding off first
552   02BC            CASJ2V PXODLY,PZDLY         ;Check X dephasing
553   02BC            CASJ2A L1=50$,L12=70$
554   02BC            $$
555
556          ; Z imaging compensation gradient terminates first
557   02BD   20$:     GRADS <X,1.0,IMG>           ;Leave on the X imaging gradient
558   02BD            GRADS <Y,1.0,IMG,COR>       ;and the Y
559   02BD   ...      <GRADS <Z,0.0>>,$$          ;Turn off the Z
560   02BE            WFRMIN <PXODLY,PYDLY>,4,-2  ;Wait for the shorter of X and Y
561   02C5            CASJMP 60$                  ;Residue is Y phase encoding off first
562   02C5            CASJ2V PXODLY,PYDLY         ;Check X dephasing
563   02C5            CASJ2A L1=40$,L12=70$
564   02C5            $$
565
566          ; X imaging gradient terminates first
567   02C6   30$:;    GRADS <X,0.0>               ;Turn off the X imaging gradient
568   02C6            GRADS <Y,1.0,IMG,COR>       ;Leave on the Y
569   02C6   ...      <GRADS <Z,1.0,IMG,COR>>,$$  ;and Z
570   02C7            WFRMIN <PYDLY,PZDLY>,4,-2   ;Wait for the shorter of Y and Z
571   02CE            CASJMP 40$                  ;Residue is Z phase encoding off first
572   02CE            CASJ2V PYDLY,PZDLY          ;Check Y phase encoding
573   02CE            CASJ2A L1=50$,L12=70$
574   02CE            $$
575
576          ; Y imaging gradient is still on
577   02CF   40$:;    GRADS <X,0.0>               ;Turn off the X imaging gradient if necessary
578   02CF            GRADS <Y,1.0,IMG,COR>       ;Leave on the Y
579   02CF   ...      <GRADS <Z,0.0>>,$$          ;Turn off the Z if necessary
580   02D0            WTFOR <PYDLY,-2.>,4         ;Wait for Y
581   02D7   ...      <JUMP 70$>,$$               ;Now turn it off
582
583          ; Z imaging gradient is still on
584   02D8   50$:;    GRADS <X,0.0>               ;Turn off the X imaging gradient if necessary
585            ;      GRADS <Y,0.0>               ;Ditto Y
586   02D8   ...      <GRADS <Z,1.0,IMG,COR>>,$$  ;Leave on the Z
587   02D9            WTFOR <PZDLY,-2.>,4         ;Wait for Z
588   02E0   ...      <JUMP 70$>,$$               ;Now turn it off
589
590          ; X imaging gradient is still on
591   02E1   60$:     GRADS <X,1.0,IMG>           ;Leave on the X imaging gradient
592          ;        GRADS <Y,0.0>               ;Turn off the Y if necessary
593   02E1   ...      <GRADS <Z,0.0>>,$$          ;Ditto Z
594   02E2            WTFOR <PXODLY,-1>,4         ;Wait for the X interval
595
596          ; Turn off all gradients and wait til time to turn on the Z slice
597          ;   selection gradient
598   02E9   70$:     GRADS <X,0.0>,<Y,0.0>       ;Everything off
599   02E9   ...      <GRADS <Z,0.0>>,$$          ;
600   02EA   CALC CASE1,<<TE,0.5>,<HSAMTM,-1.0>,<DL20,1.0>,<SMI,0.5>,<XW1,-0.5>,<DL5,-1.0>,-8>
601   02EA            WTFOR CASE1,4               ;Wait til time for
602   02F1   ...      <JUMP ECHCOM>,$$            ;... the slice selection gradient
603
604
605
606          ; Acquire a secondary even echo.  Continue dephasing the X signal
607          ; and reverse phase the Y and Z signals
608   02F2   EVECHO:   MRKTIM 4                   ;Mark end of the acquisition + 5 usec
609   02F2            GRADS <X,1.0,IMG>           ;Leave on the X imaging gradient
610   02F2            GRADS <Y,1.0,IMG,COR>       ;Turn on the Y imaging correction gradient
611   02F2   ...      <GRADS <Z,1.0,IMG,COR>>,$$  ;Ditto Z
612
613          ; Service the shortest post acquisition gradient interval
614   02F3            WFRMIN <PXEDLY,PYDLY,PZDLY>,4,-2
615   02FA            CASJMP 20$                  ;The residue is Z phase encoding off first
616   02FA            CASJ3V PXEDLY,PYDLY,PZDLY   ;Check X dephasing first
617   02FA            CASJ3A L1=30$,L12=50$,L13=40$
618   02FA            CASJ3V PYDLY,PZDLY,PXEDLY   ;Check Y phase double coding next
619   02FA            CASJ3A L1=10$,L12=60$,L13=50$,L123=70$
620   02FA            $$
621
622          ; Y imaging compensation gradient terminates first
623   02FB   10$:     GRADS <X,1.0,IMG>           ;Leave on the X imaging gradient
624          ;        GRADS <Y,0.0>               ;Turn off Y
625   02FB   ...      <GRADS <Z,1.0,IMG,COR>>,$$  ;Leave on the Z
626   02FC            WFRMIN <PXEDLY,PZDLY>,4,-2  ;Wait for shorter of X and Z
627   0303            CASJMP 60$                  ;Residue is Z phase encoding off first
628   0303            CASJ2V PXEDLY,PZDLY         ;Check X dephasing
629   0303            CASJ2A L1=50$,L12=70$
630   0303            $$
631
632          ; Z imaging compensation gradient terminates first
633   0304   20$:     GRADS <X,1.0,IMG>           ;Leave on the X imaging gradient
634   0304            GRADS <Y,1.0,IMG,COR>       ;and the Y
635   0304            <GRADS <Z,0.0>>,$$          ;Turn off the Z
```

```
636   0305              WFRMIN <PXEDLY,PYDLY>,4,-2    ;Wait for the shorter of X and Y
637   030C              CASJMP 60$                    ;Residue is Y phase encoding off first
638   030C                 CASJ2V PXEDLY,PYDLY        ;Check X dephasing
639   030C                 CASJ2A L1=40$,L12=70$
640   030C                 $$
641
642         ; X imaging gradient terminates first
643   030D   30$:;        GRADS <X,0,0>               ;Turn off the X imaging gradient
644   030D                GRADS <Y,1,0,IMG,COR>       ;Leave on the Y
645   030D          ...   <GRADS <Z,1,0,IMG,COR>>,$$  ;and Z
646   030E              WFRMIN <PYDLY,PZDLY>,4,-2     ;Wait for the shorter of Y and Z
647   0315              CASJMP 40$                    ;Residue is Z phase encoding off first
648   0315                 CASJ2V PYDLY,PZDLY         ;Check Y phase encoding
649   0315                 CASJ2A L1=50$,L12=70$
650   0315                 $$
651
652         ; Y imaging gradient is still on
653   0316   40$:;        GRADS <X,0,0>               ;Turn off the X imaging gradient if necessary
654   0316                GRADS <Y,1,0,IMG,COR>       ;Leave on the Y
655   0316          ...   <GRADS <Z,0,0>>,$$          ;Turn off the Z if necessary
656   0317              WTFOR <PYDLY,-2,>,4           ;Wait for Y
657   031E          ...   <JUMP 70$>,$$               ;Now turn it off
658
659         ; Z imaging gradient is still on
660   031F   50$:;        GRADS <X,0,0>               ;Turn off the X imaging gradient if necessary
661          ;            GRADS <Y,0,0>               ;Ditto Y
662   031F          ...   <GRADS <Z,1,0,IMG,COR>>,$$  ;Leave on the Z
663   0320              WTFOR <PZDLY,-2,>,4           ;Wait for Z
664   0327          ...   <JUMP 70$>,$$               ;Now turn it off
665
666         ; X imaging gradient is still on
667   0328   60$:         GRADS <X,1,0,IMG>           ;Leave on the X imaging gradient
668          ;            GRADS <Y,0,0>               ;Turn off the Y if necessary
669   0328          ...   <GRADS <Z,0,0>>,$$          ;Ditto Z
670   0329              WTFOR <PXEDLY,-1>,4           ;Wait for the X interval
671
672         ; Turn off all gradients and wait til time to turn on the Z slice
673         ;    selection gradient
674   0330   70$:         GRADS <X,0,0>,<Y,0,0>       ;Everything off
675   0330          ...   <GRADS <Z,0,0>>,$$          ;
676   0331              CALC CASE1,<<TE,0,5>,<HSAMTM,-1,0>,<DL20,1,0>,<SMI,0,5>,<XW1,-0,5>,<DL5,-1,0>,-7>
677   0331              WTFOR CASE1,4                 ;Wait til time for
678
679   0338   ECHCOM: ...  <JSUB PIPULS>,$$            ;the pi pulse gradients. Make the pulse
680   0339          ...   <MRKTIM 4>,$$               ;Mark return
681
682         ; Wait for end of line n Z rephasing
683   033A                GRADS <X,1,0,AUX>           ;Leave X freq encoding pulse on
684   033A                GRADS <Y,1,0,AUX>           ;Leave Y freq encoding pulse on
685   033A                GRADS <Y,-1,0,IMG>          ;Turn on Y phase encoding pulse
686   033A          ...   <GRADS <Z,1,0,AUX>>,$$      ;Leave Z freq encoding pulse on
687   033B              WTFOR <DL5,DL7,-1,0>,4        ;Wait for end of freq encoding pulses
688
689         ; Turn off all freq encoding (AUX) gradients
690   0342          ...   <GRADS <Y,-1,0,IMG>>,$$
691   0343              WTFOR <DL1,-2,0>,4            ; Wait for end of y phase encoding
692
693   034A   30$:    ...  <GRADS <Z,0,0>>,$$          ;All gradients off
694   034B              WTFOR <<TE,0,5>,<POSPI,-1,0>,<SMI,0,5>,<DL20,-1,0>>,4
695
696         ; Turn on the X imaging gradient in preparation for sampling
697   0352   ACQXON: ...  <GRADS <X,1,0,IMG>>,$$      ;Turn on the X imaging gradient
698                       .IF EQ FKSEQ                ;If constant frq
699          ;                                        ;  and bias coil not specified
700   0353                  .IIF EQ BCLMS,SLCFRQ 0    ;then Reset to the receiver frequency
701                       .ENDC
702   0355              WTFOR <TE,<XW2,-0,5>,<HSAMTM,-1,0>,<SMI,0,5>,<-OOTODO-<8,*OOTODI>>>,2
703
704         ; Do the acquisition in the appropriate mode
705   035C              GOTO <ACQ1KP,ACQ1KP,ACQ1KA,ACQ1KA,ACQ1KN,ACQ1KN,ACQ1KN,ACQ1KN>,0
706
707
708         ; Perform a selective pi pulse of the appropriate phase
709   0377   PIPULS:
710   0377              CASJMP 10$                    ;If suppressed slice selection
711   0377              CASJMP ,<<20$,<<<<MC1,(9:9)>>,EQ,0>>>>
712   0377                 $$
713   0378   10$:    ...  <JUMP 30$>,$$               ;Timing fill
714
715   0379   20$:         GRADS <X,1,0,AUX>           ;Turn on the slice selection gradient
716   0379                GRADS <Y,1,0,AUX>           ;Y
717   0379                GRADS <Z,1,0,AUX>           ;Z
718                       .IF NE BCLMS                ;If bias coil multislice
719                       GRADS <ZRANGE,,0>           ;Offset group 0 bias
720                       .ENDC
721   0379                $$
722   037A              WTFOR <DL5,<-OOTODO-<8,*OOTODI>-1>>,-1  ;Wait til time for the pi pulse
723   0381   30$:
724   0381              GOTO <35$,50$,35$,50$,35$,50$,35$,50$>,0  ;Dispatch on pi pulse phase
725
726         ; Normal phase pi pulses
727   039C   35$:         SHPRFP MC(2:0),XW1,XA1,,70,XS1,RTRN
728
```

```
729              ; Inverted phase pi pulses
730    03A1  50$:      SHPRFP  MC(2:0),XW1,XA1,,270,XS1,RTRN
731
732          ; Slice fill
733    03A6  FL:    ... <GRADS <X,0,0>,<Y,0,0>,<Z,0,0>>,$$   ;Gradients off
734                  .IF NE IRSEG                             ;If inversion recovery sequence
735    03A7          WTFOR MSSGIFILL,-1                       ;Wait til time for the inversion pulse
736    03AE          CASJMP 10$                               ;If suppressed slice selection
737    03AE          CASJMP ,<<20$,<<<<MC1,(11:11)>,EQ,0>>>>
738    03AE          $$
739    03AF  10$:  ... <JUMP 30$>,$$                          ;Timing fill
740    03B0  20$:    GRADS <X,1,0,AUX>                        ;All auxillary gradients on
741    03B0          GRADS <Y,1,0,AUX>                        ;
742    03B0          GRADS <Z,1,0,AUX>                        ;
743                  .IF NE BCLMS                             ;If bias coil multislice
744                  GRADS <ZRANGE,,1>                        ;Offset group 1 bias
745                  .ENDC
746    03B0          $$
747    03B1          WTFOR <DL5,-1>,-1                        ;Warm up
748
749          ;30$:   IF EQ DISSEQ                             ;If not a DISE sequence,
                                                               load regular IR code
750           ;      SHPRFP  MC(8:6),XW3,XA3,,0,XS3
751           ;
752           ;             ;GRADS <X,0,0>                    ;
753           ;             ;GRADS <Y,0,0>                    ;
754           ;          ... <GRADS <Z,0,0>>,$$               ;Turn off gradients
755           ;
756           ;             WTFOR MSIRIFILL,-1                ;Wait til time for the next pi/2
757           ;
758          ;Begin code for the driven inversion
759           ;          .IFF                                 ;If a DISE sequence
760    03B8  30$:        CASJMP 50$                           ;If supressed AZG
761    03B8              CASJMP ,<<40$,<<<<MC1,(11:11)>>,EQ,0>>>>  ;If non-supressed AZG
762    03B8              $$
763    03B9  40$:        RFPULS XW3,0.5,XA3                   ;Selective pi/2 for the driven inversion
764                                                           ; Set XW3 to 94 us width to give a
765                                                           ; hard pi pulse. The 0.5 multiplication
766                                                           ; factor sets up the pi/2 pulse. Thus,
767                                                           ; tune XW3 for the pi pulse and the pi/2
768                                                           ; will take care of itself.
769
770    03C0              MRKTIM 10
771    03C0              GRADS <X,1,0,AUX,COR>                ;Turn on the X refocusing gradient
772    03C0              GRADS <Y,1,0,AUX,COR>                ;and the Y refocusing gradient
773    03C0          ... <GRADS <Z,1,0,AUX,COR>>,$$           ;and the Z refocusing gradient
774    03C1              WTFOR <DL2,-2,0>                     ;2 us correction as before (??)
775                      ;GRADS <X,0,0>                       ;Turn off all gradients
776                      ;GRADS <Y,0,0>                       ;
777    03C8          ... <GRADS <Z,0,0>>,$$                   ;
778    03C9              WTFOR <<DL15,0,5>,<XW1,-0,5>,<DL5,-1,0>>,10
779                                                           ;Wait for pi pulse selection
780    03D0              GRADS <X,1,0,AUX>                    ;Turn on X slice selection for the pi
781    03D0              GRADS <Y,1,0,AUX>                    ;Ditto, Y
782    03D0          ... <GRADS <Z,1,0,AUX>>,$$               ;Ditto, Z
783    03D1              WTFOR <<DL15,0,5>,<XW2,-0,5>,<XW2,-0,5>>,10
784    03D8              RFPULS XW3,,XA3,,90                  ;Pi pulse--choose phase for
785                                                           ; driven inversion, not driven equilibrium
786                                                           ;Note, don't bother with phase compensation
787                                                           ; since this subsequence is not collected
788                      ;GRADS <X,0,0>                       ;Turn gradients off
789                      ;GRADS <Y,0,0>                       ;
790    03DF          ... <GRADS <Z,0,0>>,$$                   ;
791    03E0              WTFOR <DL15,<XW2,-0,5>,<XW2,-0,5>,<DL5,-1,0>>,10  ;Wait for pi/2 pulse
792    03E7              GRADS <X,1,0,AUX>                    ;Turn on X slice selection for the pi
793    03E7              GRADS <Y,1,0,AUX>                    ;Ditto, Y
794    03E7          ... <GRADS <Z,1,0,AUX>>,$$               ;Ditto, Z
795    03E8              WTFOR DL5,-1
796    03EF              RFPULS XW3,,XA3                      ;Pi/2 pulse of the same phase as the
797                                                           ; last pi/2 pulse
798    03F6          ... <MRKTIM 11>,$$                       ;Mark the time reference for MSIRIFILL
799                                                           ; Note...you can't have a MRKTIM followed
800                                                           ; by a WTFOR (see p. 243 of the handouts)
801    03F7              WTFOR DL16,-1                        ;Wait a time for dephasing
802    03FE          ... <JUMP 60$>,$$
803
804    03FE  50$:   ;Non-selsecitve DISE. Don't use gradients during hard RF pulses
805           ; because there is no A/D read during this subsequence
806           ; (i.e., residual transverse mag. will not spill over into the readout).
807                      ;GRADS <X,0,0>                       ;Turn off gradients
808                      ;GRADS <Y,0,0>
809    03FE          ... <GRADS <Z,0,0>>,$$
                          Error  ;LOAD  --Multiply defined immediate field
810    03FF              RFPULS XW3,,XA2,,0                   ;Do a non-selective driven inversion
811    0406          ... <MRKTIM 10>,$$
812    0407              WTFOR <<DL15,0,5>,<46,5,-0,5>,<93,-0,5>>,10  ;Wait for pi pulse
813    040E              RFPULS 93,,,XA2,,270                 ;Pi pulse-choose phase for driven
814                                                           ; inversion, not driven equilibrium
815    0415              WTFOR <DL15,<46,5,-0,5>,<46,5,-0,5>>,10  ;Wait for pi/2 pulse
816    041C              RFPULS 46,5,,XA2,,0                  ;Pi/2 pulse of the same phase as the
```

```
817                                                              ; last pi/2 pulse
818    0423                    MRKTIM 11                         ;Time marker for MSIRIFILL
819    0423                    GRADS <X,1.0,AUX>                 ;Turn on the dephasing gradients
820    0423                    GRADS <Y,1.0,AUX>                 ;
821    0423                ... <GRADS <Z,1.0,AUX>>,$$
822    0424                    WTFOR DL16,-1                     ;Wait a time for dephasing
823
824    042B    60$:           ;GRADS <X,0.0>                     ;All gradients off again
825                           ;GRADS <Y,0.0>                     ;
826    042B                ... <GRADS <Z,0.0>>,$$
827    042C                    WTFOR MSIRIFILL,11                ;Wait til time for the next pi/2
828
829                        .IFF
830                            WTFOR2 SLICEFILL,,-1,-5           ;Wait for interslice fill time
831                        .ENDC
832    0433                ... RTRN,$$                           ;and return
833
834                        .END
```

Symbol table

| | | | | | | | | | |
|---|---|---|---|---|---|---|---|---|---|
| ACQXON | 0352R | 02 | DLIMKB= | 0063 | ENACOV= | 0012 | FKSWT = | 0007 | GREADF= 0040 |
| ACQ1KA= | **** GX | | DL1PT | 0078 | ENACUV= | 0011 | FL | 03A6R | 02 GREFLG= 8000 |
| ACQ1KN= | **** GX | | DL1MKB= | 0065 | ENDFSL= | 004C | FLAG = | 001C | GRFLGS 0002 |
| ACQ1KP= | **** GX | | DL1PT | 007A | ENSMOV= | 0016 | FLGS.V= | 0000 | GRGFLG= 4000 |
| AC0 =% | 0000 | | DLKMKB= | 0066 | ENSMUV= | 0015 | FMSWT = | 0006 | GRGPNM= 0007 |
| AC1 =% | 0001 | | DLKPT | 007C | ENXADR= | 0020 | FGIR1 | 0207R | 02 GRGSTF= 0008 |
| AC2 =% | 0002 | | DLIMKB= | 0049 | ENXILL= | 001E | FGIR10 | 022AR | 02 GRICOR= 0002 |
| AC3 =% | 0003 | | DL1PT | 0056 | ENXNXT= | 001F | FGIR11 | 022FR | 02 GRISCL= 0001 |
| AC4 =% | 0004 | | DL2MKB= | 004A | ENXPOP= | 0023 | FGIR12 | 0234R | 02 GRPFLG= 2000 |
| AC5 =% | 0005 | | DL2PT | 005B | ENXPSH= | 0024 | FGIR13 | 0239R | 02 GRRFLG= 4000 |
| ADD = | 0020 | | DL3MKB= | 004B | ENXREG= | 0021 | FGIR14 | 023ER | 02 GRRPHF= 0080 |
| AD00 = | 0018 | | DL3PT | 005A | ENXSKE= | 0022 | FGIR15 | 0243R | 02 GRSADF= 0020 |
| AD01 = | 0019 | | DL4MKB= | 004C | ENZPGR= | 0034 | FGIR16 | 0248R | 02 GRSRSF= 0010 |
| AD1 | 008AR | 02 | DL4PT | 005C | EOPTCF= | 0047 | FGIR17 | 024DR | 02 GRTBPT 00A2 |
| AD1R | 0091R | 02 | DL5MKB= | 004D | EOSFLG= | 0080 | FGIR2 | 020CR | 02 GRXFLG= 000F |
| AD10 = | 001A | | DL5PT | 005E | EPGDOV= | 004B | FGIR20 | 0252R | 02 GRYFLG= 00F0 |
| AD11 = | 001B | | DL6MKB= | 004E | EPGDUV= | 004A | FGIR3 | 0211R | 02 GRZFLG= 0F00 |
| AD2 | 009FR | 02 | DL6PT | 0060 | EPOADR= | 0009 | FGIR4 | 0216R | 02 GROFLG= 1000 |
| AD2R | 00A6R | 02 | DL7MKB= | 0051 | EPOODD= | 000A | FGIR5 | 021BR | 02 GTMPT 00AA |
| AD3 | 00B4R | 02 | DL7PT | 0062 | EPS3TM= | 0031 | FGIR6 | 0220R | 02 HSAMTM 0000R OE |
| AD3R | 00BBR | 02 | DL8MKB= | 0052 | ERDADR= | 000B | FGIR7 | 0225R | 02 IGA.V = 0000 |
| AD4 | 00C9R | 02 | DL8PT | 0064 | ERDODD= | 000C | FGSY1 | 0205R | 02 INE = 0040 |
| AD4R | 00D0R | 02 | DL9MKB= | 0053 | ERFADR= | 0019 | FGSY10 | 022BR | 02 IRFA.V= 0000 |
| AGAIN | 0003R | 02 | DL9PT | 0066 | ERFANZ= | 003E | FGSY11 | 022DR | 02 IRIMKB= 0054 |
| ALNMKB= | 0003 | | DONE = | 0080 | ERFAOV= | 0044 | FGSY12 | 0232R | 02 IRIPT 0080 |
| ALTERN= | 0001 | | DSPMKB= | 0002 | ERFAUV= | 0043 | FGSY13 | 0237R | 02 IRPC = 0011 |
| AMDMKB= | 003D | | DTRG.N= | 0000 | ERFPOW= | 003F | FGSY14 | 023CR | 02 IRSEQ = 0001 |
| AMDPT | 004E | | EABSOR= | 0032 | ERLFOR= | 003A | FGSY15 | 0241R | 02 IRSWT = 0005 |
| AXC0 = | 001E | | EACBUF= | 0007 | ERMPT | 0004 | FGSY16 | 0246R | 02 LBFPT 00A8 |
| AXC1 = | 001F | | EACDIR= | 0008 | ERPOAD= | 0018 | FGSY17 | 024BR | 02 LIST = 0000 |
| BCLMS = | 0000 | | EACSML= | 0006 | ERPTGR= | 003C | FGSY2 | 020AR | 02 LOAD.V= 0000 |
| BFTBPT | 00A4 | | EAXCN1= | 0049 | ERPTLD= | 0028 | FGSY20 | 0250R | 02 LSTMKB= 0001 |
| BGM = | 000B | | EAXCN4= | 0048 | ERPTNC= | 0027 | FGSY3 | 020FR | 02 LSXMKB= 0009 |
| CARDGT= | 0001 | | EBFORD= | 002C | ERPTN1= | 0041 | FGSY4 | 0214R | 02 MCADJ 0000 |
| CDIMKB= | 0043 | | EBUFNM= | 002F | ERPTOV= | 0042 | FGSY5 | 0219R | 02 MCAPT 00A6 |
| COMGET= | 0003 | | ECHCOM | 0338R | 02 ERPTSZ= | 0017 | FGSY6 | 021ER | 02 MCFLGS 0002 |
| COMM = | 0007 | | ECNTN1= | 0029 | ERPWOV= | 0016 | FGSY7 | 0223R | 02 MCLIST= 0000 |
| CSR = | 0010 | | ECNTVL= | 0026 | ERPWUV= | 001B | FRGMKB= | 0012 | MCKD0 0004 |
| DBA0 = | 0012 | | EDSSHC= | 004D | ERRPT | 0000 | FRGPT | 0046 | MCWD1 0006 |
| DBA1 = | 0013 | | EDTADR= | 0005 | ERSTAD= | 003B | FRGO = | 0005 | MC1MKB= 0007 |
| DISSEQ= | 0001 | | EDTBUF= | 0003 | ERSTDF= | 0037 | FRG1 = | 0006 | MC1PT 0022 |
| DLAMKB= | 0059 | | EDTNUM= | 0004 | ESMIOV= | 000E | GDLPT | 007E | MC2MKB= 0008 |
| DLAPT | 0068 | | EDUPAD= | 0033 | ESMIUV= | 000D | GMA = | 0003 | MC2PT 0024 |
| DLBMKB= | 005A | | EETIME= | 002A | ESQZCT= | 0040 | GNKMKB= | 0031 | MDSWT = 0004 |
| DLBPT | 006A | | EFCODE= | 0000 | ESSLNM= | 0046 | GNKPT | 003C | MESWT = 0003 |
| DLCMKB= | 005B | | EFDIR = | 0002 | ESTKNZ= | 004E | GOTODI= | 0002 | MORMKB= 004B |
| DLCPT | 006C | | EFTYPE= | 0001 | ETTBOV= | 0035 | GOTODO= | 0003 | MORPT 0018 |
| DLDMKB= | 005C | | EGRDIF= | 0036 | EUASHP= | 004F | GRACOR= | 0008 | MXTFLG= 003F |
| DLDPT | 006E | | EGRFAD= | 003D | EVECHO | 02F2R | 02 GRADJ | 0000 | MSIRIF= **** GX |
| DLEMKB= | 005D | | EGRNRS= | 0038 | EWFRNM= | 002E | GRAD.F= | 0000 | MSSGIF= **** GX |
| DLEPT | 0070 | | EGRTSZ= | 0045 | EWFROV= | 0010 | GRAMMX= | 003B | N = 0011 |
| DLFMKB= | 005E | | EGRZCT= | 0039 | EWFRRF= | 002D | GRAMPL | 0004 | NCAD0 = E330 |
| DLFPT | 0072 | | EJUMPO= | 002B | EWFRUV= | 000F | GRAPHF= | 0100 | NCAD00= E330 |
| DLGMKB= | 0061 | | ELINNM= | 0030 | EXATOV= | 0014 | GRASCL= | 0004 | NCAD01= E332 |
| DLGPT | 0074 | | EMCADR= | 001D | EXATUV= | 0013 | GRD1.A= | 01B4R | 07 NCAD1 = E334 |
| DLHMKB= | 0062 | | EMKTPT= | 0029 | FIX.F = | 0000 | GRD1.M= | 0000 | NCAD10= E334 |
| DLHPT | 0076 | | EMPOAD= | 001A | FKSEQ = | 0000 | GRD2.M= | 0000 | NCAD11= E332 |

| | | | | | | | | |
|---|---|---|---|---|---|---|---|---|
| NCAXC0= | E33C | NSCFL1= | 0100 | NSRATN= | 0100 | PXEDLY | 001CR | OE SBGTPU= 0080 |
| NCAXC1= | E33E | NSCFL2= | 0400 | NSRFAD= | 0FFF | PXODLY | 001BR | OE SBGTPO 004A |
| NCBASE= | E300 | NSCFL3= | 1000 | NSRFAP= | 3000 | PYDLY | 0020R | OE SBHOOK= 4000 |
| NCBGMD= | E316 | NSCFOR= | 4000 | NSRFCT= | 0008 | PZDLY | 0024R | OE SBICNT 004E |
| NCCOMM= | E30E | NSCINT= | 0020 | NSRFEN= | 0004 | RATN = | 0001 | SBICTA 0052 |
| NCCSR = | E320 | NSCJP = | 0003 | NSRFMA= | 0400 | RCAMKB= | 0015 | SBLNK0 0070 |
| NCDBA = | E324 | NSCJPP= | 000B | NSRFMD= | 0C00 | RCAPT | 0048 | SBLNKU 0040 |
| NCDBA0= | E324 | NSCJS = | 0001 | NSRFPH= | 0200 | RCFMKB= | 0016 | SBLNKY 006E |
| NCDBA1= | E326 | NSCJV = | 0006 | NSRFBL= | 1400 | RCFPT | 004A | SBRFEN 0056 |
| NCFLAG= | E338 | NSCLTO= | 4000 | NSRPCT= | 0009 | REPT.V= | 0000 | SBRFPF 006C |
| NCFRG = | E30A | NSCOMM= | 0700 | NSRPHS= | 0003 | RESPGT= | 0002 | SBRFPI= 0001 |
| NCFRG0= | E30A | NSCONC= | 2000 | NSR07K= | 0000 | RFADJ | 0000 | SBRFPU= 0040 |
| NCFRG1= | E30C | NSCONT= | 000E | NSR15K= | 0001 | RFDMKB= | 0017 | SBRFPW 005A |
| NCGBMO= | B000 | NSCRTN= | 000A | NSR30K= | 0002 | RFFLGS | 0002 | SBRFP0 004C |
| NCGBM1= | 0FFF | NSCSR = | 1000 | NSR60K= | 0003 | RFGTSZ= | 001C | SBSIZ = 0036 |

| Symbol | Value | Symbol | Value | Symbol | Value | Symbol | Value | Symbol | Value | |
|---|---|---|---|---|---|---|---|---|---|---|
| NCGMA = | E306 | NSDBA0= | 1200 | NSSEGA= | 1500 | RFM = | 000C | SBTIME | 005E | |
| NCGXM0= | 2000 | NSDBA1= | 1300 | NSSFL1= | 0200 | RFMA = | 0004 | SBVLID= | 8000 | |
| NCGXM1= | 0FFF | NSDIAT= | 8000 | NSSFL2= | 0800 | RFNEG = | 2000 | SB29CF | 0066 | |
| NCGYM0= | 4000 | NSDBAP= | 0030 | NSSFL3= | 2000 | RFPH = | 0002 | SB29CI= | 0008 | |
| NCGYM1= | 0FFF | NSEEEN= | 0010 | NSSGEN= | 0001 | RFSGTM | 0000 | SB29CU= | 0200 | |
| NCGZM0= | 6000 | NSFLAG= | 1C00 | NSSSM = | 0002 | RFSSL = | 0014 | SB29C0 | 0046 | |
| NCGZM1= | 0FFF | NSFL1 = | 0200 | NSSTP = | 0004 | RFSSLT | 0018 | SDLMKB= | 0045 | |
| NCIRPC= | E322 | NSFL2 = | 0800 | NSSUB = | 0030 | RFSXCT | 0004 | SDLPT | 004C | |
| NCMCD = | E32C | NSFL3 = | 2000 | NSSYEN= | 0008 | RFSXT | 0000 | SHPSR | 0255R | 02 |
| NCMCD0= | E32C | NSFOR = | 8000 | NSTOUT= | 8000 | RFSYCT | 000C | SILMKB= | 0037 | |
| NCMCD1= | E32E | NSFRG0= | 0500 | NSTSTM= | 0004 | RFSYT | 0008 | SILPT | 0088 | |
| NCMCM0= | 0000 | NSFRG1= | 0600 | NSTWB = | 000F | RFSZCT | 0014 | SINCPI= | 0000 | |
| NCMCM1= | 0FFF | NSGMA = | 0300 | NSXGMD= | 0800 | RFSZT | 0010 | SLCPT | 009E | |
| NCPRI = | 00C0 | NSIAC0= | 1600 | NSYGMD= | 0900 | RFWD1 | 0004 | SMIMKB= | 003A | |
| NCRATN= | E302 | NSIAC1= | 1700 | NSZGMD= | 0A00 | RFXPHS= | 3000 | SMIPT | 0050 | |
| NCRFMA= | E308 | NSIGMA= | 0040 | N1SMKB= | 0064 | RFX000= | 0000 | SMPL.V= | 0000 | |
| NCRFMD= | E318 | NSINEN= | 0040 | ODECHO | 02A8R | 02 RFX090= | 1000 | SOFMKB= | 0013 | |
| NCRFM0= | A000 | NSINSF= | 000F | OPTPT | 00AC | RFX180= | 2000 | SOFPT | 0042 | |
| NCRFM1= | 0FFF | NSINT = | 0080 | PADLY | 000CR | 0E RFX270= | 3000 | SGACND | 001AR | |
| NCRFPH= | E304 | NSIRMA= | 0080 | PASS = | 0010 | RF1ST = | 8000 | SGACPT | 0018R | |
| NCRFSL= | E328 | NSIRPC= | 1100 | PASSNM | 0002 | RPTMKB= | 0041 | SGCMND | 001ER | |
| NCSEGA= | E32A | NSJMAP= | 0002 | PGIMKB= | 003C | RPTPT | 0054 | SGCMPT | 001CR | |
| NCSINX= | E33A | NSJRP = | 0007 | PGIPT | 001E | SBACOF | 0062 | SGCOD | 0000R | |
| NCVEC = | 0120 | NSJSRP= | 0005 | PGSWT = | 0002 | SBACOI | 0020 | SGDTND | 000CR | |
| NCVECT= | E300 | NSJZ = | 0000 | PGTMKB= | 003E | SBACOU | 0800 | SGDTPT | 000AR | |
| NCXGMD= | E310 | NSLDCT= | 000C | PGTPT | 0020 | SBAC00 | 0042 | SGGRND | 0016R | |
| NCYGMD= | E312 | NSLICE= | 0010 | PG1MKB= | 003F | SBAC1F | 0064 | SGGRPT | 0014R | |
| NCZGMD= | E314 | NSLOAD= | 1F00 | PG1PT | 001A | SBAC1I= | 0010 | SGIMKB= | 0044 | |
| NECHO = | 0008 | NSLOOP= | 000D | PG2MKB= | 0040 | SBAC1U= | 0400 | SGINND | 0012R | 15 |
| NEXT.V= | FFFF | NSMCD0= | 1600 | PG2PT | 001C | SBAC10 | 0044 | SGINPT | 0010R | 15 |
| NOAG = | 0000 | NSMCD1= | 1700 | PHSMKB= | 0011 | SBADDR | 003E | SGIPT | 009A | |
| NSADD = | 0020 | NSMMKB= | 0039 | PHSPT | 0026 | SBBEG | 003C | SGMCND | 0006R | |
| NSAD00= | 1800 | NSMPT = | 0052 | PIPULS | 0377R | 02 SBBUSY= | 2000 | SGMCPT | 0004R | |
| NSAD01= | 1900 | NSNOAG= | 0000 | POSPI | 0008R | 0E SBCPT | 00A0 | SGMCWD | 0008R | |
| NSAD10= | 1A00 | NSPASS= | 0010 | POSTPI | 0288R | 02 SBFLAG | 003C | SGMTND | 000AR | 15 |
| NSAD11= | 1B00 | NSPUSH= | 0004 | PREPI | 0004R | 0E SBGTCF | 0068 | SGMTPT | 0008R | |
| NSAGM = | 1000 | NSP000= | 0000 | PSGDLY | 0010R | 0E SBGTCI= | 0004 | SGPOND | 0002R | 15 |
| NSAGML= | 1000 | NSP090= | 0001 | PS1 | 0083R | 02 SBGTCU= | 0100 | SGPOPT | 0000R | 15 |
| NSAGMH= | 0000 | NSP180= | 0002 | PS2 | 0098R | 02 SBGTND | 0048 | SGRDND | 0006R | 15 |
| NSAXC0= | 1E00 | NSP270= | 0003 | PS2FLG= | 8000 | SBGTDS= | 1000 | SGRDPT | 0004R | 15 |
| NSAXC1= | 1F00 | NSGMKB= | 003B | PS3 | 00ADR | 02 SBGTPF | 006A | SGRFND | 0010R | |
| NSBGMD= | 0800 | NSGPT | 009C | PS4 | 00C2R | 02 SBGTPI= | 0002 | SGRFPT | 000ER | |
| SGRFWD | 0012R | XCDLY | 0014R | 0E ZCDPT | 008A | .GETI2= | **** GX | .SFGN1= | **** GX | |
| SGRPND | 000ER | 15 XGM = | 0008 | ZCPT | 008C | .GETI4= | **** GX | .SFG0 = | **** GX | |
| SGRPPT | 000CR | 15 XI1MKB= | 0046 | ZGM = | 000A | .GETMS= | **** GX | .SHAP1= | **** GX | |
| SGSWND | 0022R | XI1PT | 003E | ZRCMKB= | 0020 | .GOTO = | 0000 | .SHAP3= | **** GX | |
| SGSWPT | 0020R | XI2MKB= | 0047 | ZRCPT | 0098 | .GOTO1= | 0001 | .SHPAR= | **** GX | |
| SGTYP | 0002R | XI2PT | 0040 | ZRMKB = | 001C | .GOTO2= | 0001 | .SHPI1= | **** GX | |
| SGUPT | 0008 | XK0MKB= | 0031 | ZRPT | 0096 | .GRBAS= | 0000RG | 07 .SHPI2= | **** GX | |
| SRADI | 00DDR | 02 XK1MKB= | 0032 | ZSLOPT | 0090 | .GREND= | 0000R | 14 .SHPMX= | 0100 | |
| SRADN | 00DBR | 02 XK2MKB= | 0033 | ZTBPT | 008E | .I = | 0011 | .SHPSS= | 0009 | |
| SRCOM | 00E3R | 02 XK3MKB= | 0034 | $ = | 008AR | 0D .INBAS= | 0000R | 09 .SHPW1= | **** GX | |
| SRNOAI | 00E1R | 02 XONDLY= | 0032 | %. = | 0434R | 02 .INEND= | 0000R | 16 .SHPW2= | **** GX | |
| SRNOAN | 00DFR | 02 XS1MKB= | 001B | $2 = | 2198R | 03 .J = | 0009 | .SLCA1= | **** GX | |
| SRPSI | 00D9R | 02 XS1PT | 002C | .ACBAS= | 0000R | 15 .L = | 0001 | .SLCBS= | 00EBR | 02 |
| SRPSN | 00D7R | 02 XS2MKB= | 001F | .ACDON= | **** GX | .LINAJ= | **** GX | .SLCBZ= | 0011 | |
| SRSMKB= | 0014 | XS2PT | 0032 | .ACEND= | 0000R | 1A .LINBS= | 01ECR | 02 .SLFG2= | **** GX | |
| SRSPT | 0044 | XS3MKB= | 0023 | .ADJX0= | **** GX | .LINSZ= | 0002 | .SM = | 0000 | |
| SSLMKB= | 0036 | XS3PT | 003B | .AIBAS= | 0000R | 0E .M = | 0100 | .SWBAS= | 0000R | 08 |
| SSLPT | 0086 | XWCMKB= | 0035 | .APBAS= | 0000R | 0F .MCBAS= | 0000RG | 02 .SWEND= | 0000R | 1D |
| SUB = | 0030 | XW1MKB= | 0019 | .A1KA1= | **** GX | .MCBS1= | 0000R | 03 .SYN3B= | **** GX | |
| BYSMKB= | 0018 | XW1PT | 002B | .A1KA2= | **** GX | .MCEND= | 0000R | 10 .SYN3D= | **** GX | |
| TCPTTB | 0000 | XW2MKB= | 001D | .BFRCK= | **** GX | .MCSHP= | **** GX | .SYN3R= | **** GX | |
| TDSWT = | 0001 | XW2PT | 002E | .CASE1= | **** GX | .MIN03= | **** GX | .SY3DM= | **** GX | |
| TEMKB = | 0055 | XW3MKB= | 0021 | .CJMP2= | **** GX | .MTBAS= | 0000RG | 05 .T = | 0400 | |
| TEPT | 0082 | XW3PT | 0034 | .CJMP3= | **** GX | .MTEND= | 0000R | 12 .T1 = | 0001 | |
| TE2MKB= | 0056 | X001H = | 000F | .COBAS= | 0000R | 1B .N = | 0001 | .T2 = | 0001 | |
| TE2PT | 0084 | X001KH= | F000 | .COEND= | 0000R | 1C .NSGB1= | **** GX | .T3 = | 0001 | |
| TIMEPT | 0006 | X001MH= | 0F00 | .C2CHK= | 089BR | 0D .PASS = | 0002 | .T4 = | 0000 | |
| TRMMKB= | 0004 | X010H = | 00F0 | .C3CHK= | 07D4R | 0D .PGATE= | **** GX | .T5 = | 0000 | |
| UNGATD= | 0000 | X010KH= | 000F | .DTBAS= | 0000R | 04 .POBAS= | 0000R | 0A .T6 = | 0000 | |
| VALU.F= | 0000 | X010MH= | F000 | .DTEND= | 0000R | 11 .POEND= | 0000R | 17 .USDM = | 2000 | |
| WDCPT | 003A | X100H = | 0F00 | .E = | 0000 | .RDBAS= | 0000R | 0B .USDW = | 0001 | |
| WOWRF = | 0000 | X100KH= | 00F0 | .EXPBH= | 000B | .RDEND= | 0000R | 18 .V = | FFFF | |
| XA1MKB= | 001A | YGM = | 0009 | .EXPBL= | 000B | .RFBAS= | 0000RG | 06 .W = | 0001 | |
| XA1PT | 002A | ZACMKB= | 002E | .EXPRN= | **** GX | .RFEND= | 0000R | 13 .XAN = | 001A | |
| XA2MKB= | 001E | ZACPT | 0094 | .FGCEN= | **** GX | .RFPT = | **** GX | .XATNA= | **** GX | |
| XA2PT | 0030 | ZAMKB = | 002D | .FGRNG= | **** GX | .RPBAS= | 0000R | 0C .XATN1= | **** GX | |
| XA3MKB= | 0022 | ZAPT | 0092 | .G = | 0001 | .RPEND= | 0000R | 19 .XSN = | 001B | |
| XA3PT | 0036 | ZCDMKB= | 0042 | .GETI1= | **** GX | .SFGN0= | **** GX | | | |

| | | | |
|---|---|---|---|
| ABS. | 00AE | 00 | (RW,I,GBL,ABS,OVR) |
| | 0024 | 01 | (RW,I,LCL,REL,CON) |
| SEGADR | 0434 | 02 | (RW,D,LCL,REL,CON) |
| SEGCOD | 21A0 | 03 | (RW,D,LCL,REL,CON) |
| DTRIG | 0000 | 04 | (RW,D,LCL,REL,OVR) |
| SMRKTM | 0024 | 05 | (RW,D,LCL,REL,CON) |
| RFATBL | 00A8 | 06 | (RW,D,LCL,REL,CON) |
| CRDTBL | 01B8 | 07 | (RW,D,LCL,REL,CON) |
| SWTCHS | 0008 | 08 | (RW,D,LCL,REL,CON) |
| SINIT | 024E | 09 | (RW,I,LCL,REL,CON) |

```
$POLSH   0122  0A   (RW, D, LCL, REL, CON)
$RLDIR   0008  0B   (RW, D, LCL, REL, CON)
$RFPTR   004C  0C   (RW, D, LCL, REL, CON)
$ADJCD   0CBC  0D   (RO, I, LCL, REL, CON)
$ADJID   0028  0E   (RW, D, LCL, REL, CON)
$ADJPD   00E0  0F   (RO, D, LCL, REL, CON)
BEQCDE   0000  10   (RW, D, LCL, REL, OVR)
DTRIGA   0000  11   (RW, D, LCL, REL, OVR)
$RMKTM   0000  12   (RW, I, LCL, REL, CON)
RFATIM   0000  13   (RW, D, LCL, REL, OVR)
GRDTIM   0000  14   (RW, D, LCL, REL, OVR)
$ACBLK   0014  15   (RW, D, LCL, REL, CON)
$INITA   0002  16   (RW, I, LCL, REL, CON)
$POLSI   0000  17   (RW, D, LCL, REL, OVR)
$RLDIS   0000  18   (RW, D, LCL, REL, OVR)
$RFPTS   0000  19   (RW, D, LCL, REL, OVR)
.?????   0000  1A   (RO, D, LCL, REL, OVR)
COMMNT   0000  1B   (RW, D, LCL, REL, CON)
COMMNU   0000  1C   (RW, D, LCL, REL, OVR)
SWTCHT   0000  1D   (RW, D, LCL, REL, OVR)
```

While it will be appreciated that modifications may be made to this software while still achieving the benefits of the present invention, this is the presently preferred approach.

As the specific hardware usable in the present invention may be of any conventional type previously known or subsequently generated for use in respect of inversion spin echo magnetic resonance imaging, disclosure of the same need not be provided herein in detail.

While readily known to those skilled in the art an example of hardware usable in the present invention will be provided. An Oxford Superconducting magnet in combination with a PDP-11/24 minicomputer and a sequencer computer that stores collected data before sending it to the PDP-11/24 minicomputer. Additional equipment may include a floating point system array processor, a PTS frequency synthesizer, DEC-VT-100 computer terminals, raster graphics display terminals and a matrix imaging camera for exposing paper and film.

While reference to visual display means has been made herein so as to suggest "real-time" display, it will be appreciated that visual display can be accomplished by storing the image information and subsequently displaying the same as on film and hard copies, for example. Such storage shall be deemed to be embraced within reference herein to visual display means, as an indirect means of getting information from the computer means to the visual display means.

While for convenience of disclosure herein reference has been made to collection of a slice or volume it will be appreciated that the system may be employed to obtain data from multiple slices simultaneously. This may be accomplished by pulsing different slices simultaneously by the use of appropriate gradients and RF pulse sequences during the TI and TD intervals.

It will be appreciated, therefore, that the present invention provides an effective means for increasing the speed of imaging while maintaining the same or providing enhanced image contrast and feature detection in inversion spin echo magnetic resonance imaging. All of this is accomplished in a reliable, economical and efficient manner.

Whereas particular embodiments of the present invention have been described above for purposes of illustration, it will be appreciated by those skilled in the art that numerous variations of the details may be made without departing from the invention as described in the appended claims.

We claim:

1. A method of inversion spin echo magnetic resonance imaging including providing a specimen disposed within a main magnetic field, a source of pulsed RF signals, receiver means for receiving signals from said specimen responsive to said RF pulses and emitting responsive output signals, computer means for receiving said output signals from said receiver means and establishing image information related thereto and visual display means for displaying images from said image information, during an initial echo period imposing three pulses on said main magnetic field with the first and third said pulses having a first value and the second said pulse having a second value substantially larger than said first value, creating a first echo with said second pulse, converting said first echo into negative longitudinal magnetization by said third pulse, after an inversion recovery period, during a second echo period imposing fourth and fifth pulses on said main magnetic field in the same sequence as said first and second pulses, respectively, creating a second spin echo with said fifth pulse, responsive to the said spin echo, emitting said output signals from said receiver means to said computer means, responsive to receipt of said output signals by said computer means, emitting image information directly or indirectly from said computer means to said visual display means, whereby said visual display means will display the image obtained from said echo pulse.

2. The method of claim 1 including establishing said first pulse at about 70 to 110 degrees.

3. The method of claim 2 including repeating said five-pulse cycle a predetermined number of times in order to generate additional image information.

4. The method of claim 3 including establishing said first and third pulses at approximately 90 degrees, establishing said second and fifth pulses at approximately 180 degrees and establishing said fourth pulse between about 10 and 170 degrees.

5. The method of claim 4 including delaying initiation of a first said pulse in the next subsequent cycle of operation after said second spin echo in the next preceding cycle of operation by a predetermined time period.

6. The method of claim 5 wherein establishing the image information obtained from said spin echo by the following relationship:

$$I = KNe^{-TE2/T2}\{1 + e^{-TI/T1}[(2e^{-(TD+\frac{1}{2}TE2)/T1} - e^{-(TD+TE2)/T1} - 1)e^{-TE1/T2} - 1]\}$$

wherein:
I = the actual pixel intensity,
N = density of sensitive nuclear spins in the sample,
K = a scale factor based on electronics, slice thickness and the like,
KN = the theoretical pixel intensity in the absence of RF pulses,
$T_1 = T_1$ relaxation,
$T_2 = T_2$ relaxation,
TD = the delay time from the peak of the acquired echo to the initiation of a new cycle initiated by a 90 degrees pulse i.e., the delay time necessary for $T_1$ recovery in order for another cycle to be initiated,
TI = the inversion time i.e., the time from the middle of the second 90 degree pulse of the inversion pulse triplet that starts each sequence to the middle of the 90 degree pulse which begins the reading event,
$TE_1$ = the echo time from the middle of the initiating 90 degree pulse to the peak of the spin echo which is converted to inverted longitudinal magnetization, and
$TE_2$ = the echo time from the middle of the 90 degree pulse beginning the reading event to the peak of the resultant spin echo.

7. The method of claim 5 establishing the said first echo period aproximately equal to the $T_2$ relaxation period.

8. The method of claim 7 including establishing the time relationships between said $T_2$ relaxation period and said second echo time period $TE_2$ such that $TE_2$ is much shorter than $T_2$ and preferably less than 0.25 times $T_2$.

9. The method of claim 6 establishing the duration of said inversion time TI approximately equal to said $T_1$ relaxation period.

10. The method of claim 9 establishing the time relationship between said repetition time TD and said $T_1$ relaxation period such that TD is about 2.5 to 4.0 times $T_1$.

11. The method of claim 1 including said first through fifth pulses applied generally perpendicularly to said main magnetic field.

12. The method of claim 4 including
employing as a frame of reference X-Y-Z axis coordinates,
establishing said main magnetic field on said Z-axis, and
establishing a magnetic field gradient along said Z-axis.

13. The method of claim 12 including imposing between said fourth pulse and the subsequent echo a gradient pulse along said Y-axis.

14. The method of claim 13 including varying the strength of said Y-axis magnetic field gradient in subsequent repetitions of said five-pulse cycle.

15. The method of claim 12 including prior to said fifth pulse, imposing a magnetic field gradient of positive polarity on said X-axis, or after the fifth pulse imposing a magnetic field gradient of negative polarity on said X-axis.

16. The method of claim 12 including after said fifth pulse imposing a magnetic field gradient of positive polarity on said X-axis generally throughout the duration of said spin echo.

17. The method of claim 16 including establishing said X-axis gradient and said Y-axis gradient when the slice selective RF pulses are not on.

18. The method of claim 17 including maintaining said Z-axis gradient during said fourth and fifth pulses.

19. The method of claim 4 including
creating said first, third and fourth pulses in phase, and
creating said second and fifth pulses 90 degrees out of phase.

20. The method of claim 1 including prior to delivering said image information from said computer means to said visual display means, storing said image information.

21. The method of claim 16 including
employing said X-axis as the frequency encoding axis, and
employing said Y-axis as the phase encoding axis.

22. The method of claim 21 including employing a patient as said specimen.

23. The method of claim 1 including performing Fourier Transformations on said output signals to convert amplitude versus time data into amplitude versus frequency data in creating said image information.

24. Apparatus for inversion spin echo magnetic resonance imaging comprising
magnetic field generating means for establishing a main magnetic field on a specimen,
magnetic field gradient generating means for establishing gradients in said main magnetic field strength,
RF signal generating means for emitting pulsed RF signals to at least portions of said magnetic field passing through said specimen,
said RF signal generating means having means for generating first, and third pulses of a first value and a second pulse of second value substantially larger than said first value with said second pulse creating a first echo,
said RF signal generating means having means for generating fourth and fifth pulses on said main magnetic field in the same general sequence as said first and second pulses and thereby creating a spin echo with said fifth pulse,
receiver means for receiving signals emitted from said specimen responsive to said RF pulses and emitting responsive output signals,
computer means for receiving said output signals from said receiver means and establishing image information related thereto, and visual display means for displaying images from said image information received from said computer means, whereby said driven inversion spin echo magnetic resonance imaging will be effected with rapid scanning speeds and while maintaining high image contrast.

25. The apparatus of claim 24 including said computer means controlling operation of said RF signal generating means.

26. The apparatus of claim 25 including said RF signal generating means having means for establishing said first pulse at about 70 to 110 degrees.

27. The apparatus of claim 26 including said RF signal generating means having means for establishing said second value at approximately 180 degrees.

28. The apparatus of claim 25 including said computer means having means for establishing said image information in accordance with the following formula:

$$I = KNe^{-TE2/T2}\{1 + e^{-TI/T1}[(2e^{-(TD+\frac{1}{2}TE2)/T1} - e^{-(TD+TE2)/T1} - 1)e^{-TE1/T2} - 1]\}$$

wherein:
I = the actual pixel intensity,
N = density of sensitive nuclear spins in the sample,
K = a scale factor based on electronics, slice thickness and the like,
KN = the theoretical pixel intensity in the absence of RF pulses,
$T_1$ = $T_1$ relaxation,
$T_2$ = $T_2$ relaxation,
TD = the delay time from the peak of the acquired echo to the initiation of a new cycle initiated by a 90 degrees pulse i.e., the delay time necessary for $T_1$ recovery in order for another cycle to be initiated,
TI = the inversion time i.e., the time from the middle of the second 90 degree pulse of the inversion pulse triplet that starts each sequence to the middle of the 90 degree pulse which begins the reading event,
$TE_1$ = the echo time from the middle of the initiating 90 degree pulse to the peak of the spin echo which is converted to inverted longitudinal magnetization, and
$TE_2$ = the echo time from the middle of the 90 degree pulse beginning the reading event to the peak of the resultant spin echo.

29. The apparatus of claim 28 including said RF signal generating means having means for generating said first, third and fourth pulses at approximately 90 degrees and said second and fifth pulses at approximately 180 degrees.

30. The apparatus of claim 29 including said computer means having means for performing Fourier Transformations on said output signals to convert amplitude versus time data into amplitude versus frequency data.

31. The apparatus of claim 30 including said computer means having an analog-to-digital converter for converting said receiver means output signals into digitized signals.

32. The apparatus of claim 28 including said computer means having means for establishing said first echo period with a duration approximately equal to the $T_2$ relaxation period.

33. The apparatus of claim 32 including said computer means having means for establishing the relative duration of said second echo period $TE_2$ with respect to said $T_2$ relaxation period so that $TE_2$ is less than 0.25 times $T_2$.

34. The apparatus of claim 33 including said computer means having means for establishing the duration of said inversion time TI approximately equal to said $T_1$ relaxation period.

35. The apparatus of claim 34 including said computer means having means for establishing the relative duration of said delay time TD to said $T_1$ relaxation periods so that TD is about 2.5 to 4.0 times $T_1$.

36. The apparatus of claim 24 including
providing X-Y-Z coordinate axes, and
gradient generating means for generating magnetic field gradients on each said axis.

37. The apparatus of claim 36 including
said magnetic field generating means adapted to generate said main magnetic field on said Z-axis, and
said gradient generating means having means for generating gradients on said X and Y axes prior to or after said RF pulses, whereby spatial information will be provided in said image information.

38. The apparatus of claim 37 including gradient generating means having means for altering the strength of said gradients with successive cycles of operation.

39. The apparatus of claim 36 including said gradient generating means and said RF signal generating means cooperating with said computer means and having means for collecting data on more than one slice of said specimen simultaneously.

40. The apparatus of claim 36 including said computer means having logic means for controlling the timing, signal processing, magnetic fields and gradients and RF pulses.

41. A method of inversion spin echo magnetic resonance imaging including
providing a specimen disposed within a main magnetic field, a source of pulsed RF and magnetic gradient signals, receiver means for receiving signals from said specimen responsive to said pulsed signals and emitting responsive output signals, computer means for receiving said output signals from said receiver means and establishing image information related thereto and visual display means for displaying images from said image information,
during an initial echo period imposing three pulses on said main magnetic field with the first and third said pulses having a first value and the second said pulse having the effect of an RF pulse of a value substantially larger than said first value,
creating a first echo with said second pulse,
converting said first echo into negative longitudinal magnetization by said third pulse,
employing a said magnetic gradient pulse as at least one of said second and fifth pulses,
after an inversion recovery period, during a second echo period imposing fourth and fifth pulses on said main magnetic field in the same sequence as said first and second pulses, respectively,
creating a second spin echo with said fifth pulse,
responsive to the said spin echo, emitting said output signals from said receiver means to said computer means,
responsive to receipt of said output signals by said computer means, emitting image information directly or indirectly from said computer means to said visual display means, whereby said visual display means will display the image obtained from said echo pulse.

42. The method of claim 41 including employing said RF pulse signals as said first, second and third pulses.

43. The method of claim 42 including employing said magnetic gradient pulses as both said second pulse and said fifth pulse.

44. The method of claim 41 including establishing said image information from the following relationship:

$$I = KNe^{-TE_2/T_2}\{1 + e^{-TI/T_1}[(+e^{-TR/T_1} - 1)e^{-TE_1/T_2} - 1]\}$$

wherein:
I = the actual pixel intensity,
N = density of sensitive nuclear spins in the sample,
K = a scale factor based on electronics, slice thickness and the like,
KN = the theoretical pixel intensity in the absence of RF pulses,
$T_1$ = $T_1$ relaxation,
$T_2$ = $T_2$ relaxation,
TR = the repetition period for the entire cycle i.e. the sum of $TE_1$, TI, $TE_2$ and TD,
TI = the inversion time i.e., the time from the middle of the second 90 degree pulse of the inversion pulse triplet that starts each sequence to the middle of the 90 degree pulse which begins the reading event,
$TE_1$ = the echo time from the middle of the initiating 90 degree pulse to the peak of the spin echo which is converted to inverted longitudinal magnetization, and
$TE_2$ = the echo time from the middle of the 90 degree pulse beginning the reading event to the peak of the resultant spin echo.

45. Apparatus for inversion spin echo magnetic resonance imaging comprising
magnetic field generating means for establishing a main magnetic field on a specimen,
magnetic field gradient generating means for establishing gradients in said main magnetic field strength,
RF signal and magnetic gradient generating means for emitting pulsed RF signals and magnetic gradient signals to at least portions of said magnetic field passing through said specimen,
said RF signal and magnetic gradient signal generating means having means for generating first, and third RF pulses of a first value and a second pulse having the effect of an RF pulse of a second value substantially larger than said first value with said second pulse creating a first echo,
said RF signal and magnetic gradient generating means having means for generating a fourth RF signal and a fifth pulse having the effect of an RF pulse in the same general sequence as said first and second pulses to create a spin echo with said fifth pulse,
receiver means for receiving signals emitted from said specimen responsive to said RF pulses and emitting responsive output signals,
computer means for receiving said output signals from said receiver means and establishing image information related thereto, and
visual display means for displaying images from said image information received from said computer means, whereby said driven inversion spin echo magnetic resonance imaging will be effected with rapid scanning speeds and while maintaining high image contrast, whereby said first, third and fourth pulses may be RF pulses and at least one of said second and fifth pulses will be a magnetic gradient pulse.

46. The apparatus of claim 45 including said computer means having means for controlling operation of said RF signal and magnetic gradient generating means.

47. The apparatus of claim 46 including said computer means having means for establishing said image information in accordance with the following formula:

$$I = KNe^{-TE_2/T_2}\{1 + e^{-TI/T_1}[(+e^{-TR/T_1} - 1)e^{-TE_1/T_2} - 1]\}$$

wherein:
I = the actual pixel intensity,
N = density of sensitive nuclear spins in the sample,
K = a scale factor based on electronics, slice thickness and the like,
KN = the theoretical pixel intensity in the absence of RF pulses,
$T_1$ = $T_1$ relaxation,
$T_2$ = $T_2$ relaxation,
TR = the repetition period for the entire cycle i.e. the sum of $TE_1$, TI, $TE_2$ and TD,
TI = the inversion time i.e., the time from the middle of the second 90 degree pulse of the inversion pulse triplet that starts each sequence to the middle of the 90 degree pulse which begins the reading event,
$TE_1$ = the echo time from the middle of the initiating 90 degree pulse to the peak of the spin echo which is converted to inverted longitudinal magnetization, and
$TE_2$ = the echo time from the middle of the 90 degree pulse beginning the reading event to the peak of the resultant spin echo.

* * * * *

UNITED STATES PATENT AND TRADEMARK OFFICE
CERTIFICATE OF CORRECTION

PATENT NO. : 4,766,381

DATED : August 23, 1988

INVENTOR(S) : THOMAS E. CONTURO and ROBERT M. KESSLER

It is certified that error appears in the above-identified patent and that said Letters Patent is hereby corrected as shown below:

In the ABSTRACT, line 20, "response" should be --responsive--.

Col. 1, line 41, "coverts" should be --converts--.

Col. 3, line 6, "know" should be --known--.

Col. 6, line 67, "coresonding" should be --corresponding--.

Col. 9, line 41, "processes" should be --precesses--.

Col. 11, line 34, "with" should be --when--.

Col. 11, line 55, the arrows after "JUMP" should be replaced by ending quotation marks.

Col. 12, line 47, "for" should be --from--.

Signed and Sealed this

Twenty-fourth Day of October, 1989

Attest:

DONALD J. QUIGG

*Attesting Officer*    Commissioner of Patents and Trademarks